(12) United States Patent
Inden

(10) Patent No.: US 11,665,906 B2
(45) Date of Patent: May 30, 2023

(54) VERTICAL MEMORY DEVICE HAVING AN INSULATOR LAYER FOR IMPROVED YIELD

(71) Applicant: Kioxia Corporation, Tokyo (JP)

(72) Inventor: Tomoya Inden, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 43 days.

(21) Appl. No.: 16/794,528

(22) Filed: Feb. 19, 2020

(65) Prior Publication Data
US 2021/0066315 A1  Mar. 4, 2021

(30) Foreign Application Priority Data
Aug. 28, 2019 (JP) .............................. JP2019-155803

(51) Int. Cl.
| | | |
|---|---|---|
| *H01L 27/1157* | (2017.01) | |
| *H01L 27/11573* | (2017.01) | |
| *H01L 27/11575* | (2017.01) | |
| *H01L 27/11582* | (2017.01) | |
| *H01L 27/11565* | (2017.01) | |

(52) U.S. Cl.
CPC .... *H01L 27/1157* (2013.01); *H01L 27/11565* (2013.01); *H01L 27/11573* (2013.01); *H01L 27/11582* (2013.01)

(58) Field of Classification Search
CPC ....................................... H01L 27/1157–11597
See application file for complete search history.

(56) References Cited

U.S. PATENT DOCUMENTS

| | | | | |
|---|---|---|---|---|
| 6,549,447 B1 * | 4/2003 | Fricke | ................ | G11C 13/0004 257/E27.004 |
| 7,196,008 B1 * | 3/2007 | Shiraiwa | ........... | H01L 27/11573 257/E21.21 |
| 7,750,404 B2 * | 7/2010 | Morikado | ......... | H01L 29/78654 257/350 |
| 9,831,118 B1 * | 11/2017 | Pang | .................... | H01L 21/7682 |
| 9,940,232 B1 * | 4/2018 | Kim | ....................... | G11C 16/14 |

(Continued)

FOREIGN PATENT DOCUMENTS

JP         2011-138945 A      7/2011

OTHER PUBLICATIONS

Ga-Won Lee, et al., Reduction of Hydrogen-Induced Degradation by Using a Phosphorus-Implantation Process, Journal of the Korean Society, Jan. 2004, pp. 93-96, vol. 44, No. 1.

*Primary Examiner* — Allen L Parker
*Assistant Examiner* — Gustavo G Ramallo
(74) *Attorney, Agent, or Firm* — Kim & Stewart LLP

(57) ABSTRACT

A semiconductor memory device includes a substrate, a first conductor layer, and a first insulator layer. The substrate includes a first region on which memory cells are provided, a second region on which a control circuit of the memory cells is provided, and a third region separating the first region and the second region. The first conductor layer is above the second region of the substrate. The first insulator layer is above the second and third regions of the substrate. The first insulator layer includes a first portion that is above the first conductor layer and extends along a surface direction of the substrate, and a second portion that is continuous with the first portion and extends along a thickness direction of the substrate from the first portion toward a surface of the substrate in the third region.

20 Claims, 34 Drawing Sheets

(56) References Cited

U.S. PATENT DOCUMENTS

| | | | |
|---|---|---|---|
| 10,256,167 B1* | 4/2019 | Fukuo | H01L 27/11526 |
| 10,276,588 B2 | 4/2019 | Chuang et al. | |
| 10,325,919 B1 | 6/2019 | Teng et al. | |
| 2005/0265100 A1 | 12/2005 | Kitamura et al. | |
| 2009/0212350 A1* | 8/2009 | Ki | H01L 27/0688 |
| | | | 257/324 |
| 2010/0148269 A1* | 6/2010 | Yelehanka | H01L 29/7843 |
| | | | 257/368 |
| 2016/0181268 A1 | 6/2016 | Chuang et al. | |
| 2017/0236835 A1* | 8/2017 | Nakamura | H01L 29/42372 |
| | | | 257/314 |
| 2019/0035801 A1* | 1/2019 | Wu | H01L 21/76 |
| 2019/0057973 A1* | 2/2019 | Terada | H01L 27/11575 |

\* cited by examiner

COMPARATIVE EXAMPLE OF FIRST EMBODIMENT

FIRST EMBODIMENT

VERTICAL MEMORY DEVICE HAVING AN INSULATOR LAYER FOR IMPROVED YIELD

CROSS-REFERENCE TO RELATED APPLICATION(S)

This application is based upon and claims the benefit of priority from Japanese Patent Application No. 2019-155803, filed Aug. 28, 2019, the entire contents of which are incorporated herein by reference.

FIELD

Embodiments described herein relate generally to a semiconductor memory device.

BACKGROUND

A NAND flash memory capable of storing data in a nonvolatile manner is known.

DETAILED DESCRIPTION

Figure 1:
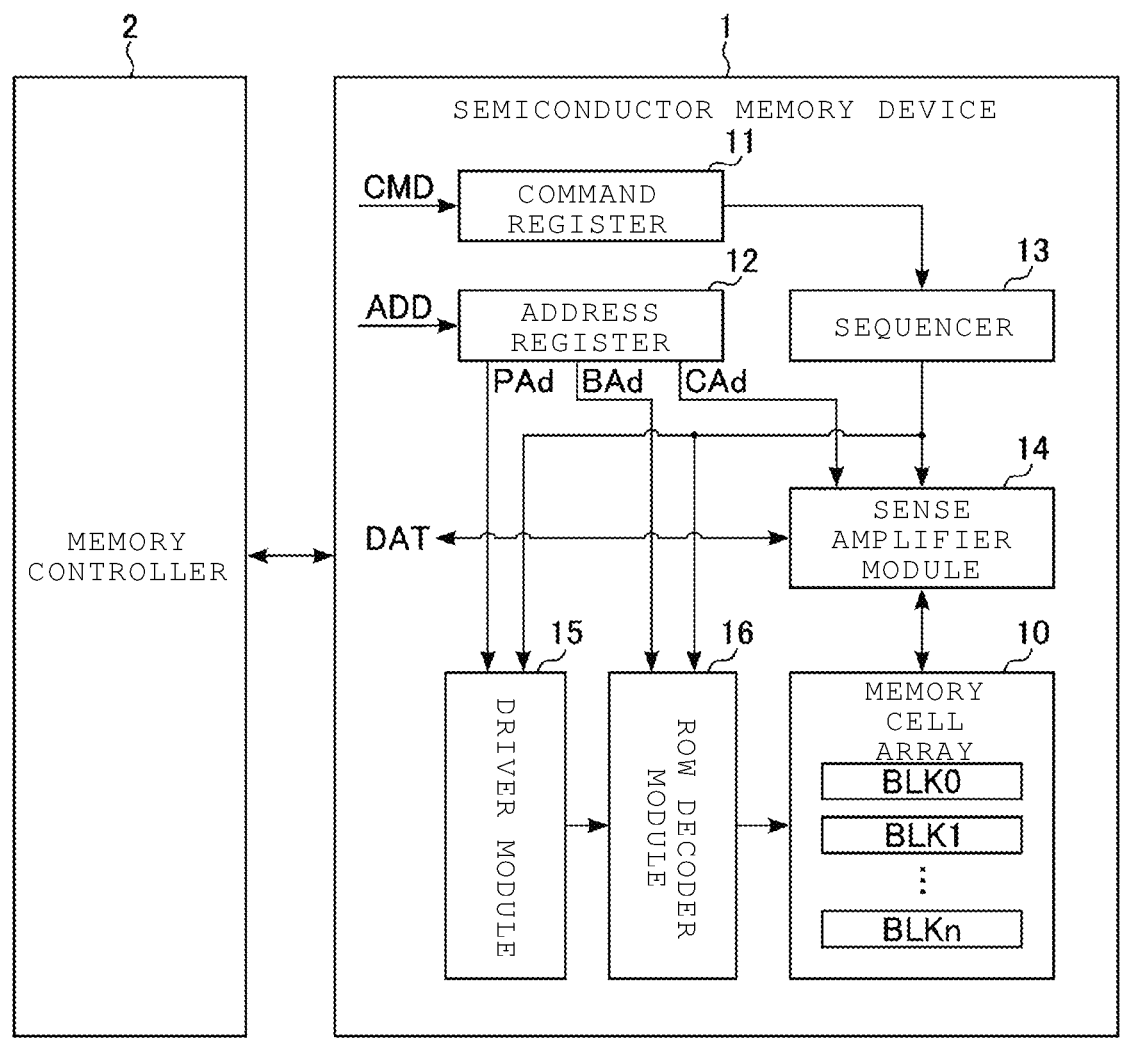
FIG. 1 is a block diagram illustrating a semiconductor memory device according to a first embodiment.

Embodiments are directed to achieving an improved yield of semiconductor memory devices.

In general, according to an embodiment, a semiconductor memory device includes a substrate, a first conductor layer, and a first insulator layer. The substrate includes a first region on which memory cells are provided, a second region on which a control circuit of the memory cells is provided, and a third region separating the first region and the second region. The first conductor layer is above the second region of the substrate. The first insulator layer is above the second and third regions of the substrate. The first insulator layer includes a first portion that is provided above the first conductor layer and extends along a surface direction of the substrate, and a second portion that is continuous with the first portion and extends along a thickness direction of the substrate from the first portion toward a surface of the substrate in the third region.

Hereinafter, example embodiments will be described with reference to the drawings. The embodiments exemplify apparatuses and methods embodying the technical concepts of the present disclosure. The drawings are schematic or conceptual, and the dimensions and ratios of the drawings are not necessarily the same as actual ones. The technical concepts of the present disclosure are not limited by the shape, structure, arrangement, and the like of the components as depicted in the drawings or as described in conjunction with the particular examples.

In the following description, components, elements, or aspects having substantially the same functions and configurations are denoted by the same reference numerals. Certain elements, components, or aspects which are repeated, or have multiple instances, may be labeled with a combination of a base reference symbol and an indexing value (e.g., word lines WL0 . . . WL7). When it is not necessary to distinguish between such labeled elements, then each may be referenced by only the base reference symbol (e.g., a word line WL) or similarly referenced as a collective (e.g., word lines WL).

[1] First Embodiment

Hereinafter, a semiconductor memory device 1 according to an embodiment will be described.

[1-1] Configuration of Semiconductor Memory Device 1

[1-1-1] Overall Configuration of Semiconductor Memory Device 1

FIG. 1 shows a configuration example of the semiconductor memory device 1 according to a first embodiment. The semiconductor memory device 1 is a NAND flash memory capable of storing data in a nonvolatile manner, and can be controlled by an external memory controller 2.

As shown in FIG. 1, the semiconductor memory device 1 includes, for example, a memory cell array 10, a command register 11, an address register 12, a sequencer 13, a sense amplifier module 14, a driver module 15, and a row decoder module 16.

The memory cell array 10 includes a plurality of blocks BLK0 to BLKn (where n is an integer of one or more). The block BLK is a set of a plurality of memory cells capable of storing data in a nonvolatile manner, and is used as a data erasing unit, for example. Further, the memory cell array 10 is provided with a plurality of bit lines and a plurality of word lines. Each memory cell is associated with, for example, one bit line and one word line. A detailed configuration of the memory cell array 10 will be described below.

The command register 11 stores a command CMD received from the memory controller 2 by the semiconductor memory device 1. The command CMD includes instructions for causing the sequencer 13 to execute a read operation, a write operation, an erase operation, and the like, for example.

The address register 12 stores address information ADD received by the semiconductor memory device 1 from the memory controller 2. The address information ADD includes, for example, a block address BAd, a page address PAd, and a column address CAd. For example, the block address BAd, the page address PAd, and the column address CAd are used to select the block BLK, the word line, and the bit line, respectively.

The sequencer 13 controls the operation of the entire semiconductor memory device 1. For example, the sequencer 13 controls the sense amplifier module 14, the driver module 15, the row decoder module 16, and the like based on the command CMD stored in the command register 11 and executes a read operation, a write operation, an erase operation, and the like.

In the write operation, the sense amplifier module 14 applies a desired voltage to each bit line according to the write data DAT received from the memory controller 2. Further, in the read operation, the sense amplifier module 14 determines data stored in the memory cell based on the voltage of the bit line, and transfers the determination result to the memory controller 2 as read data DAT.

The driver module 15 generates a voltage to be used in a read operation, a write operation, an erase operation, and the like. Then, the driver module 15 applies the generated voltage to the signal line corresponding to the selected word line based on, for example, the page address PAd stored in the address register 12.

The row decoder module 16 selects one block BLK in the corresponding memory cell array 10 based on the block address BAd stored in the address register 12. Then, the row decoder module 16 transfers, for example, a voltage applied to the signal line corresponding to the selected word line, to the selected word line in the selected block BLK.

The semiconductor memory device 1 and the memory controller 2 described above may constitute one semiconductor device in a combination thereof. Examples of such a semiconductor device include, for example, a memory card such as SD™ card, a solid state drive (SSD), and the like.

[1-1-2] Circuit Configuration of Memory Cell Array 10

Figure 2:
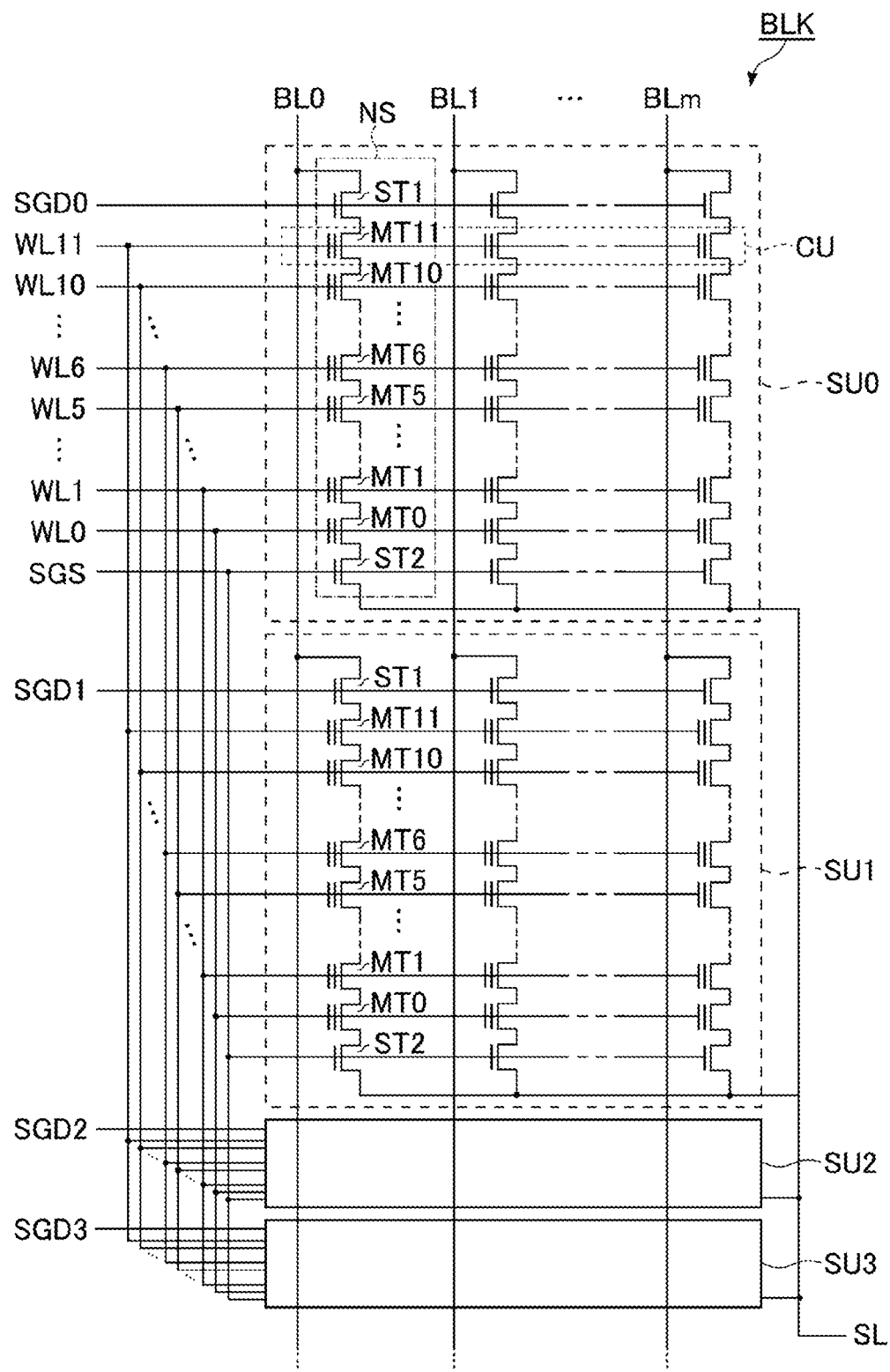
FIG. 2 is a circuit diagram illustrating a memory cell array in the semiconductor memory device according to the first embodiment.

FIG. 2 shows an example of a circuit configuration of the memory cell array 10 in the semiconductor memory device 1 according to the first embodiment, in which one block BLK is extracted from the plurality of blocks BLK in the memory cell array 10. As shown in FIG. 2, the block BLK includes, for example, four string units SU0 to SU3.

Each string unit SU includes a plurality of NAND strings NS respectively associated with the bit lines BL0 to BLm (where m is an integer of 1 or more). Each NAND string NS includes, for example, memory cell transistors MT0 to MT11 and select transistors ST1 and ST2. The memory cell transistor MT includes a control gate and a charge storage layer, and stores data in a nonvolatile manner. Each of the select transistors ST1 and ST2 is used to select the string unit SU during various operations.

In each NAND string NS, the memory cell transistors MT0 to MT11 are connected in series. The drain of the select transistor ST1 is connected to the associated bit line BL, and the source of the select transistor ST1 is connected to one end of the memory cell transistors MT0 to MT11 connected in series. The drain of the select transistor ST2 is connected to the other end of the memory cell transistors MT0 to MT11 connected in series. The source of the select transistor ST2 is connected to a source line SL.

In the same block BLK, the control gates of the memory cell transistors MT0 to MT11 are commonly connected to the word lines WL0 to WL11, respectively. The gates of the select transistors ST1 in the string units SU0 to SU3 are commonly connected to select gate lines SGD0 to SGD3, respectively. The gates of the select transistors ST2 are commonly connected to the select gate line SGS.

In the circuit configuration of the memory cell array 10 described above, the word lines WL0 to WL5 correspond to a hole LMH described below, and the word lines WL6 to WL11 correspond to a hole UMH described below. The bit line BL is shared by the NAND strings NS to which the same column address is assigned in each string unit SU. For example, the source line SL is shared among a plurality of blocks BLK.

A set of a plurality of memory cell transistors MT connected to a common word line WL in one string unit SU is referred to as a cell unit CU, for example. For example, the storage capacity of the cell unit CU including the memory cell transistors MT each storing 1-bit data is defined as "one page data". The cell unit CU may have a storage capacity of two or more page data depending on the number of bits of data stored in the memory cell transistors MT.

The circuit configuration of the memory cell array 10 in the semiconductor memory device 1 according to the first embodiment is not limited to the configuration described above. For example, the number of memory cell transistors MT and select transistors ST1 and ST2 in each NAND string NS may be designed to any number. The number of string units SU in each block BLK may be designed to any number.

Further, one or more dummy word lines may be provided between the word lines WL5 and WL6. When dummy word lines are provided, dummy transistors are provided between the memory cell transistors MT5 and MT6 of each NAND string NS in the number corresponding to the number of dummy word lines. The dummy transistor has a structure similar to that of the memory cell transistor MT and is a transistor that is not used for storing data.

[1-1-3] Structure of Semiconductor Memory Device 1

An example of the structure of the semiconductor memory device 1 according to the first embodiment will be described below. In the drawings referred to below, the X-direction corresponds to the extending direction of the word line WL, the Y-direction corresponds to the extending direction of the bit line BL, and the Z-direction corresponds to the vertical direction with respect to the surface of a semiconductor substrate SUB used for forming the semiconductor memory device 1. In the plan view, hatching is appropriately added in order to make the drawing easy to see. The hatching added to the plan view is not necessarily related to the material and characteristics of the component to which the hatching is added. In the cross-sectional view, the illustration of an interlayer insulating film or the like is appropriately omitted in order to make the drawing easy to see.

(Regarding the Planar Layout of the Semiconductor Memory Device 1)

Figure 3:
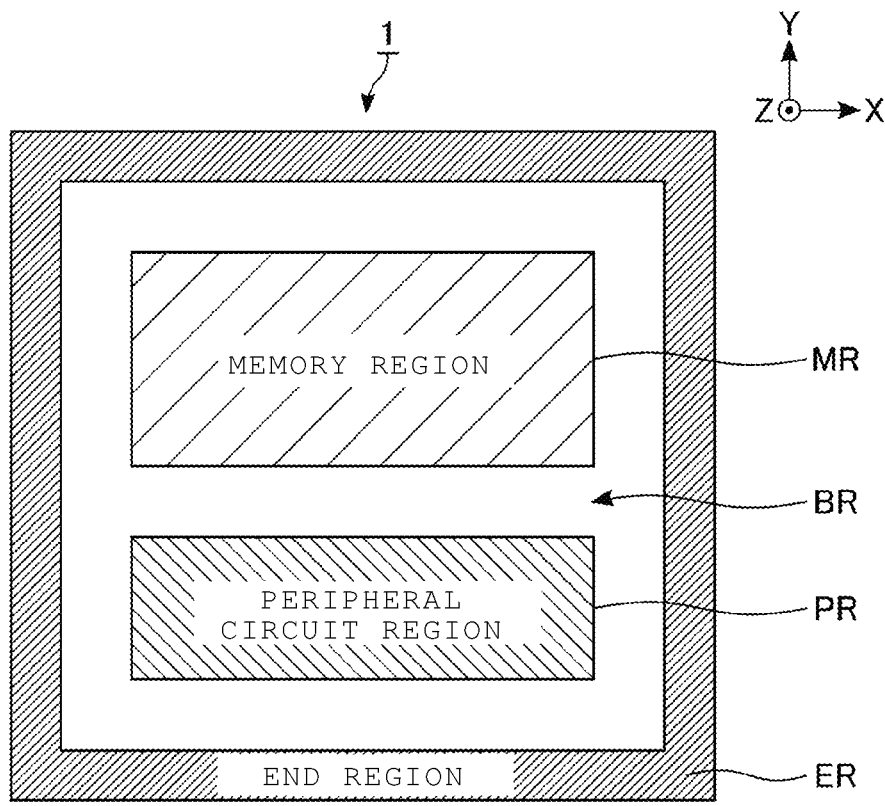
FIG. 3 illustrates a plan view of the semiconductor memory device according to the first embodiment.

FIG. 3 shows an example of a planar layout of the semiconductor memory device 1 according to the first embodiment. As shown in FIG. 3, the planar layout of the semiconductor memory device 1 is divided into, for example, a memory region MR, a peripheral circuit region PR, an end region ER, and a boundary region BR.

The memory region MR is, for example, a rectangular region provided in an inner region on the semiconductor substrate SUB, and includes the memory cell array 10. The memory region MR may be arranged in any shape and any region. When the semiconductor memory device 1 includes a plurality of memory cell arrays 10, a plurality of memory regions MR may be provided on the semiconductor substrate SUB.

The peripheral circuit region PR is, for example, a rectangular region provided in an inner region on the semiconductor substrate SUB, and includes the sequencer 13 and the like. The peripheral circuit region PR may be arranged in any shape and any region, for example, adjacent to the memory region MR in the Y-direction. A plurality of peripheral circuit regions PR may be provided on the semiconductor substrate SUB.

The end region ER is a square annular region surrounding the outer periphery of the memory region MR and the peripheral circuit region PR. The end region ER includes, for example, a structure similar to a stacked structure of the memory cell array 10 described later, and may include an alignment mark or the like. The structure in the end region ER may be removed by a dicing process at the time of manufacturing the semiconductor memory device 1.

The boundary region BR is a region that is surrounded by the end region ER and does not overlap with the memory region MR and the peripheral circuit region PR. In other words, the boundary region BR includes a portion surrounding the periphery of the memory region MR and a portion surrounding the periphery of the peripheral circuit region PR. The boundary region BR includes a structure that is directed to preventing adverse effects that may occur to the elements in the peripheral circuit region PR from the memory region MR and the end region ER during the manufacturing process of the semiconductor memory device 1.

(Regarding the Structure of the Semiconductor Memory Device 1 in the Memory Region MR)

Figure 4:
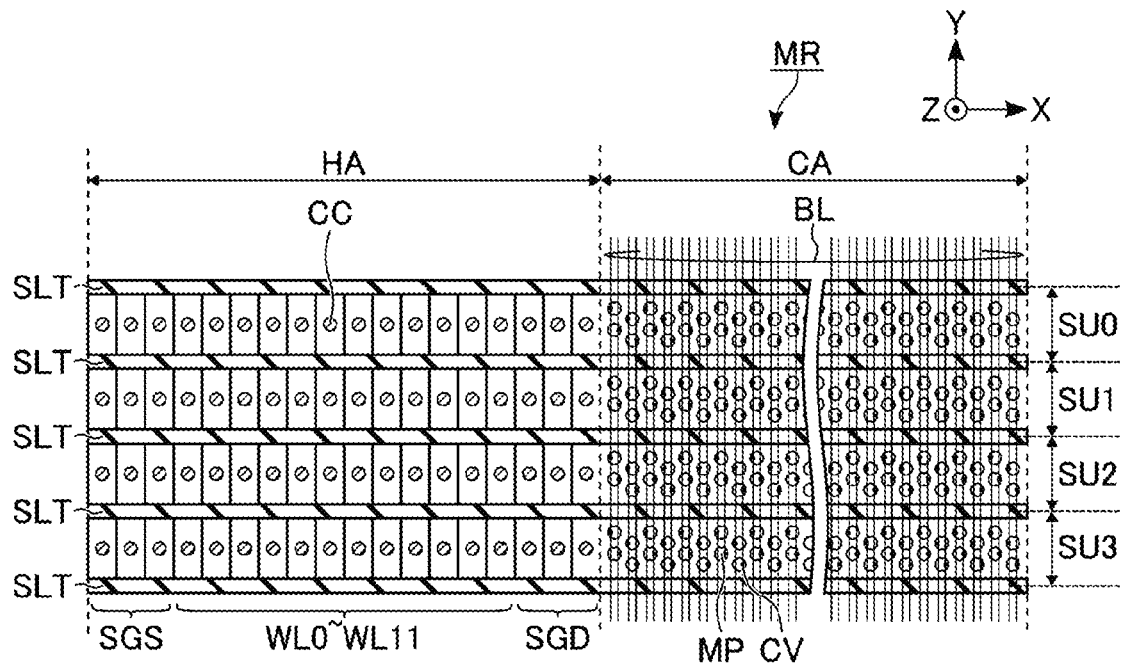
FIG. 4 illustrates a plan view of a memory region of the semiconductor memory device according to the first embodiment.

FIG. 4 is an example of a planar layout in the memory region MR of the semiconductor memory device 1 according to the first embodiment, and shows an extracted region corresponding to one block BLK (that is, string units SU0 to SU3). As shown in FIG. 4, the memory region MR includes, for example, a cell area CA and a leadout area HA (also referred to as a contact area HA). In the memory region MR, the semiconductor memory device 1 includes a plurality of slits SLT, a plurality of memory pillars MP, and a plurality of contacts CV and CC.

The cell area CA and the leadout area HA extend in the Y-direction, and are arranged in the X-direction. The cell area CA occupies most of the memory region MR. The leadout area HA is provided at one end portion in the X-direction, for example. In the leadout area HA, each of the select gate line SGS, the word lines WL0 to WL11, and the select gate line SGD includes a terrace portion that does not overlap with the upper wiring layer (conductor layer). The shape of the terrace portion that does not overlap with the upper wiring layer can be referred to as step-like, terraced, staircased, or the like. Specifically, a step (or step-change) is provided between the select gate line SGS and the word line WL0, between each adjacent pair of the word lines WL0-WL11 and between the word line WL11 and the select gate line SGD. The leadout area HA may be provided at both end portions in the X-direction.

Each of the plurality of slits SLT is provided extending along the X-direction, and crosses the cell area CA and the leadout area HA in the X-direction. Further, the plurality of slits SLT are arranged in the Y-direction. The slit SLT is provided in the same wiring layer and divides the adjacent conductor layers through the slit SLT. Specifically, the slit SLT divides a plurality of wiring layers respectively corresponding to the word lines WL0 to WL11 and the select gate lines SGD and SGS.

Each memory pillar MP functions as one NAND string NS, for example. For example, the plurality of memory pillars MP are arranged in a staggered pattern of four rows in the cell area CA and in an area between two adjacent slits SLT. However, the number and arrangement of the memory pillars MP between two adjacent slits SLT are not limited thereto, and may be changed as appropriate.

Each of the plurality of bit lines BL extends at least partially in the Y-direction, and is arranged in the X-direction. Each bit line BL overlaps with at least one memory pillar MP for each string unit SU. In this example, two bit lines BL overlap with each memory pillar MP. A contact CV is provided between one bit line BL among the plurality of bit lines BL overlapping the memory pillar MP, and the memory pillar MP. Each memory pillar MP is electrically connected to the corresponding bit line BL via the contact CV.

Each contact CC is used for connection between the word lines WL0 to WL11 and the select gate lines SGS and SGD, and the row decoder module 16. In the illustrated region, one contact CC is arranged on each terrace portion of the word lines WL0 to WL11 and the select gate lines SGS and SGD in the leadout area HA.

In the planar layout of the memory cell array 10 in the embodiment described above, each of the regions partitioned by the slits SLT corresponds to one string unit SU. That is, in this example, the string units SU0 to SU3, each extending in the X-direction, are arranged in the Y-direction. Thus, in the memory region MR and the leadout areas HA1 and HA2, for example, the layout shown in FIG. 4 is repeatedly arranged in the Y-direction.

In the example shown in FIG. 4, string units SU corresponding to the same block BLK are partitioned by slits SLT. In this case, the word lines WL and the select gate lines SGS corresponding to the same block BLK and provided in the same wiring layer are electrically connected through different wiring layers. Without being limited thereto, the slit SLT sandwiched between the slits SLT corresponding to the boundary of the block BLK only needs to divide at least the select gate line SGD. In this case, the word lines WL provided in the same wiring layer in the same block BLK are extend into and electrically connected to other components in the leadout areas HA1 and HA2.

Figure 5:
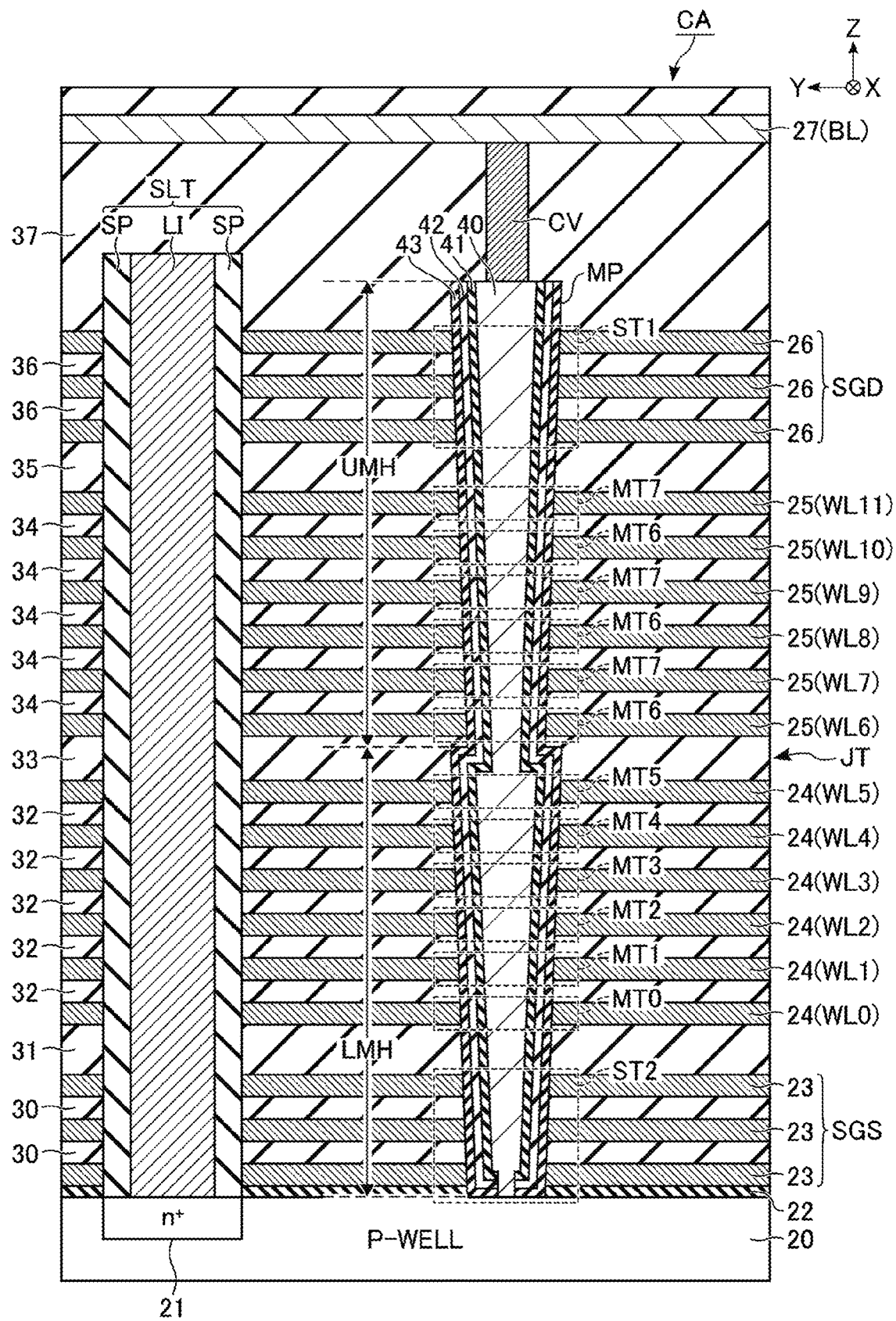
FIG. 5 illustrates a cross-sectional view of a cell area in a memory region of the semiconductor memory device according to the first embodiment.

FIG. 5 is an example of a cross-sectional structure in the cell area CA in the memory region MR of the semiconductor memory device 1 according to the first embodiment, and shows a cross section along the Y-direction including the memory pillar MP shown in FIG. 4. As shown in FIG. 5, in the cell area CA, the semiconductor memory device 1 includes a P-type well region 20, an N-type semiconductor region 21, an insulator layer 22, and conductor layers 23 to 27.

The P-type well region 20 is provided in the vicinity of the surface of the semiconductor substrate SUB. The N-type semiconductor region 21 is an N-type impurity diffusion region provided in the vicinity of the surface of the P-type well region 20. For example, phosphorus is doped in the N-type semiconductor region 21.

An insulator layer 22 is provided on the P-type well region 20. On the insulator layer 22, the conductor layers 23 and the insulator layers 30 are alternately stacked. The conductor layer 23 is formed, for example, in a plate shape spreading along the XY plane. The plurality of stacked conductor layers 23 are used as the select gate lines SGS. The conductor layer 23 contains, for example, tungsten.

An insulator layer 31 is provided on the uppermost conductor layer 23. On the insulator layer 31, conductor layers 24 and insulator layers 32 are alternately stacked. The conductor layer 24 is formed, for example, in a plate shape spreading along the XY plane. The plurality of stacked conductor layers 24 are used as word lines WL0 to WL5 in order from the P-type well region 20 side. The conductor layer 24 contains, for example, tungsten.

An insulator layer 33 is provided on the uppermost conductor layer 24. On the insulator layer 33, conductor layers 25 and insulator layers 34 are alternately stacked. The conductor layer 25 is formed, for example, in a plate shape spreading along the XY plane. The plurality of stacked conductor layers 25 are used as word lines WL6 to WL11 in order from the P-type well region 20 side. The conductor layer 25 contains, for example, tungsten.

An insulator layer 35 is provided on the uppermost conductor layer 25. On the insulator layer 35, conductor layers 26 and insulator layers 36 are alternately stacked. The conductor layer 26 is formed, for example, in a plate shape spreading along the XY plane. The plurality of stacked conductor layers 26 are used as the select gate lines SGD. The conductor layer 26 contains, for example, tungsten.

An insulator layer 37 is provided on the uppermost conductor layer 26. A conductor layer 27 is provided on the insulator layer 37. The conductor layer 27 is formed, for example, in a line shape extending in the Y-direction, and is used as the bit line BL. That is, in the region not shown, the plurality of conductor layers 27 are arranged along the X-direction. The conductor layer 27 contains, for example, copper.

The memory pillar MP is provided extending along the Z-direction and penetrates the conductor layers 23 to 26. Further, each of the memory pillars MP includes a first portion formed in the lower layer hole LMH and a second portion formed in the upper layer hole UMH.

Specifically, the first portion corresponding to the hole LMH penetrates the conductor layers 23 and 24, and the bottom thereof is in contact with the P-type well region 20. The second portion corresponding to the hole UMH is provided above the first portion corresponding to the hole LMH and penetrates the conductor layers 25 and 26. A layer including a boundary portion between the first portion and the second portion of the memory pillar MP, that is, a wiring layer provided with the insulator layer 33 is also referred to as a junction layer JT. The memory pillar MP may have a structure in which the outer diameter is increased in the junction layer JT. Hereinafter, the stacked structure in which the first portion of the memory pillar MP penetrates is referred to as a lower layer portion, and the stacked structure in which the second portion penetrates is referred to as an upper layer portion.

Each of the memory pillars MP includes, for example, a semiconductor layer 40, a tunnel insulating film 41, an insulating film 42, and a block insulating film 43. Each of the semiconductor layer 40, the tunnel insulating film 41, the insulating film 42, and the block insulating film 43 are continuous (unbroken) from the first portion to the second portion of the memory pillar MP.

Specifically, the semiconductor layer 40 is provided extending along the Z-direction. For example, the upper end of the semiconductor layer 40 is in an upper layer than the uppermost conductor layer 26, and the lower end of the semiconductor layer 40 is in contact with the P-type well region 20. The tunnel insulating film 41 covers the side surface of the semiconductor layer 40. The insulating film 42 covers the side surface of the tunnel insulating film 41. The block insulating film 43 covers the side surface of the insulating film 42.

In the structure of the memory pillar MP described above, a portion where the memory pillar MP and the conductor layer 23 intersect each other functions as the select transistor ST2. Each of a portion where the memory pillar MP and the conductor layer 24 intersect each other and a portion where the memory pillar MP and the conductor layer 25 intersect each other functions as the memory cell transistor MT. A portion where the memory pillar MP and the conductor layer 26 intersect each other functions as the select transistor ST1. That is, the semiconductor layer 40 functions as a channel for each of the memory cell transistors MT0 to MT11 and the select transistors ST1 and ST2. The insulating film 42 functions as a charge storage layer of the memory cell transistor MT.

A columnar contact CV is provided on the semiconductor layer 40 in the memory pillar MP. One conductor layer 27, that is, one bit line BL is in contact with the upper surface of the contact CV. As described above, one contact CV is connected to one conductor layer 27 (one bit line BL) in each of the spaces partitioned by the slits SLT.

The slit SLT is formed in a plate shape at least partially spreading along the XZ plane, and divides the insulator layer 22, the conductor layers 23 to 26, and the insulator layers 30 to 36. The upper end of the slit SLT is in a layer between the uppermost conductor layer 26 and the conductor layer 27. The lower end of the slit SLT is in contact with the N-type semiconductor region 21 in the P-type well region 20. Further, the slit SLT includes, for example, a contact LI and a spacer SP.

The contact LI is formed in a plate shape at least partially spreading along the XZ plane. The bottom of the contact LI is electrically connected to the N-type semiconductor region 21. The contact LI is used as the source line SL. The contact LI may be a semiconductor or a metal. The spacer SP covers the side surface of the contact LI. The contact LI is separated from each of the conductor layers 23 to 26 and the insulator layers 30 to 36 by the spacer SP. That is, the contact LI and the plurality of wiring layers adjacent to the slit SLT are insulated by the spacer SP. As the spacer SP, an insulator such as silicon oxide ($SiO_2$) or silicon nitride (SiN) is used.

Figure 6:
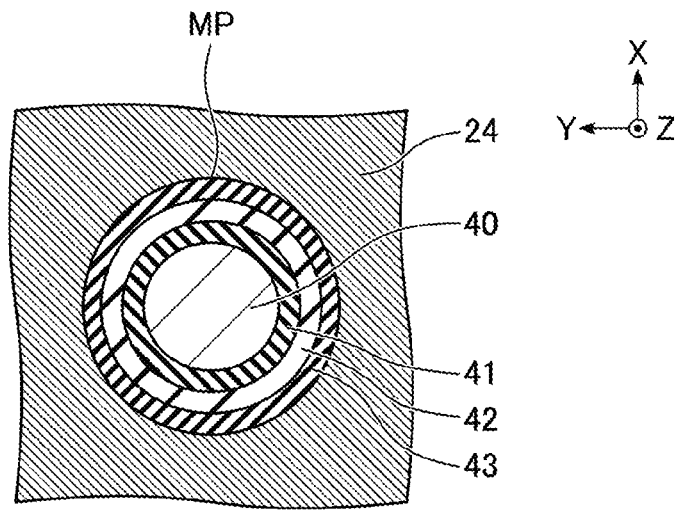
FIG. 6 illustrates a cross-sectional view of a memory pillar in the semiconductor memory device according to the first embodiment.

FIG. 6 shows an example of a cross-sectional structure of the memory pillar MP in the semiconductor memory device 1 according to the first embodiment. More specifically, FIG. 6 shows a cross-sectional structure of the memory pillar MP in a layer parallel to the surface of the semiconductor substrate SUB and including the conductor layer 24.

As shown in FIG. 6, in the layer including the conductor layer 24, the semiconductor layer 40 is provided, for example, in the center of the memory pillar MP. The tunnel insulating film 41 surrounds the periphery of the semiconductor layer 40. The insulating film 42 surrounds the periphery of the tunnel insulating film 41. The block insulating film 43 surrounds the periphery of the insulating film 42. The conductor layer 24 surrounds the periphery of the block insulating film 43. Each of the tunnel insulating film 41 and the block insulating film 43 contains, for example, silicon oxide ($SiO_2$). The insulating film 42 contains, for example, silicon nitride (SiN). Each memory pillar MP may further include an insulator layer inside the semiconductor layer 40, and the insulator layer may be located at the center of the memory pillar MP.

Figure 7:
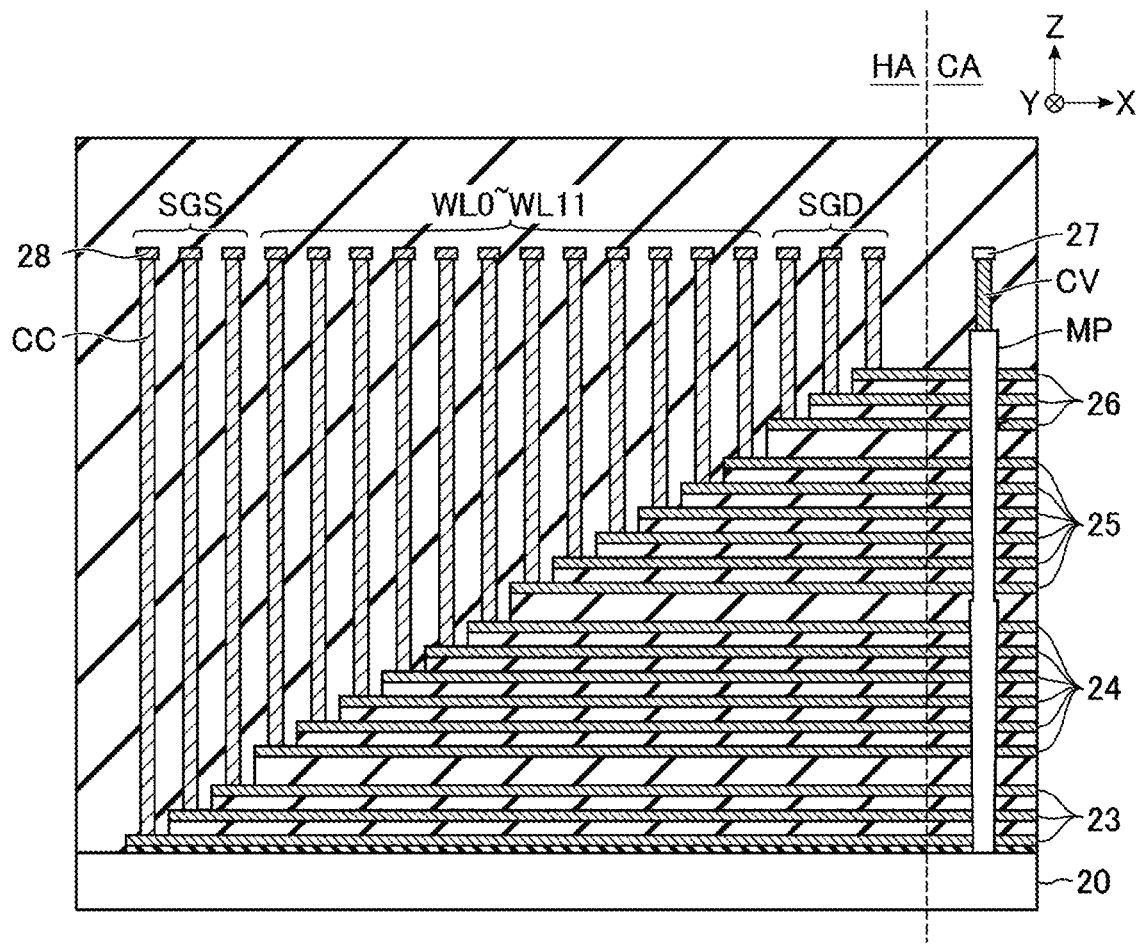
FIG. 7 illustrates a cross-sectional view of a leadout area in the memory region of the semiconductor memory device according to the first embodiment.

FIG. 7 shows an example of a cross-sectional structure in the leadout area HA in the memory region MR of the semiconductor memory device 1 according to the first embodiment. FIG. 7 also shows a part of the cell area CA. As shown in FIG. 7, in the leadout area HA, for example, the end portions of the select gate line SGS, the word lines WL0 to WL11, and the select gate line SGD are respectively provided in a stepped shape having a step in the X-direction. In addition, the plurality of contacts CC are respectively provided in respective terrace portions of the conductor layers 23 corresponding to the select gate lines SGS, the plurality of conductor layers 24 respectively corresponding to the word lines WL0 to WL5, the plurality of conductor layers 25 respectively corresponding to the word lines WL6 to WL11, and the plurality of conductor layers 26 corresponding to the select gate lines SGD.

One conductor layer 28 is provided on each contact CC. Each conductor layer 28 is electrically connected to the row decoder module 16 through another region (not separately depicted). That is, each of the conductor layers 23 to 26 is electrically connected to the row decoder module 16 via the contact CC and the conductor layer 28. The conductor layer 28 only needs to be at least in an upper layer than the uppermost conductor layer 26, and may be provided in the same wiring layer as the conductor layer 27.

In the leadout area HA, the stacked wiring may have a step in the Y-direction. For example, the number of steps formed in the Y-direction at the end of the stacked word lines WL may be designed to any number. That is, in the semiconductor memory device 1, the end portion of the word line WL in the leadout area HA may be designed in a stepped shape with any number of columns.

(Regarding the Structure of the Semiconductor Memory Device 1 in the Peripheral Circuit Region PR)

Figure 8:
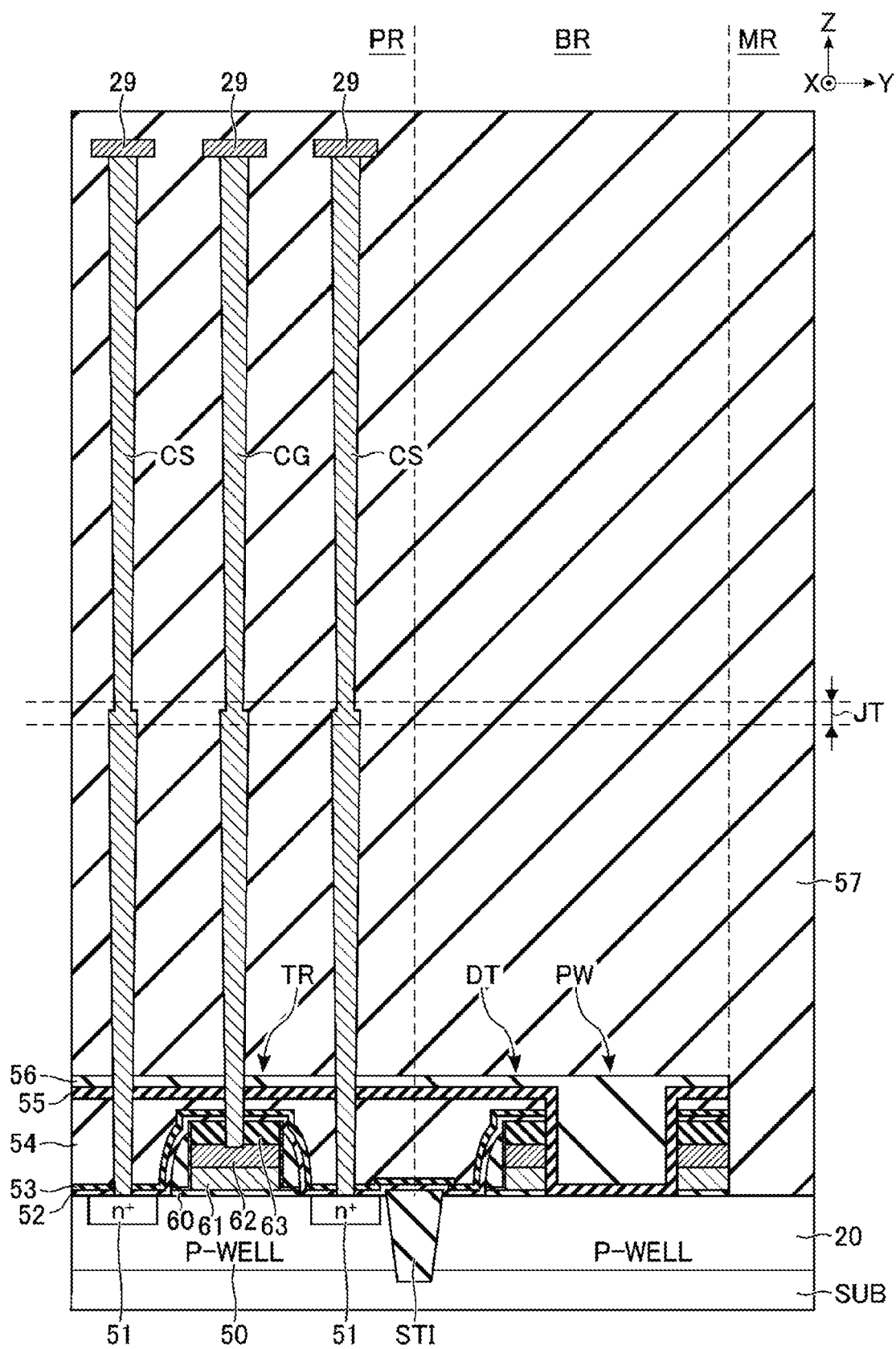
FIG. 8 illustrates a cross-sectional view of a peripheral circuit region of the semiconductor memory device according to the first embodiment.

FIG. 8 shows an example of a cross-sectional structure in the peripheral circuit region PR of the semiconductor memory device 1 according to the first embodiment. Further, FIG. 8 also shows the end of the memory region MR, and the boundary region BR between the memory region MR and the peripheral circuit region PR. As shown in FIG. 8, in the peripheral circuit region PR, the semiconductor memory device 1 includes a P-type well region 50, an N-type semiconductor region 51, an insulating region STI, insulating films 52, 53, and 55, insulators 54, 56, and 57, a gate insulating film 60, conductor layers 61 and 62, an insulator layer 63, contacts CS and CG, and a conductor layer 29.

The P-type well region 50 is provided in the vicinity of the surface of the semiconductor substrate SUB. For example, the P-type well region 50 and the P-type well region 20 are separated by the insulating region STI. The N-type semiconductor region 51 is an N-type impurity diffusion region provided in the vicinity of the surface of the P-type well region 50 and corresponds to the source or drain of the N-type transistor TR provided in the peripheral circuit region PR. For example, phosphorus is doped in the N-type semiconductor region 51.

The gate insulating film 60 is provided on the P-type well region 50. On the gate insulating film 60, conductor layers 61 and 62 and the insulator layer 63 are sequentially provided. The side surfaces (side walls) of the conductor layers 61 and 62 and the insulator layer 63 are covered with an insulator. The conductor layers 61 and 62 are used as gate electrodes of the transistors TR.

In the boundary region BR, a dummy transistor DT having a structure similar to that of the transistor TR is provided. A part of the dummy transistor DT overlaps with the blocking portion PW. The blocking portion PW is a structure for protecting the transistor TR in the peripheral circuit region PR in the manufacturing process of the semiconductor memory device 1. The gate insulating film 60, the conductor layers 61 and 62, the insulator layer 63, and insulating films 52 and 53 in the dummy transistor DT, and the insulator 54 on the dummy transistor DT are divided at a portion overlapping with the blocking portion PW.

The insulating films 52 and 53 are sequentially provided in the peripheral circuit region PR and the boundary region BR and on the semiconductor substrate SUB. The insulating film 52 covers the upper and side surfaces of the structure corresponding to the transistor TR, the upper and side surfaces of the structure corresponding to the dummy transistor DT, and the upper portion of the insulating region STI. The insulating films 52 and 53 include portions provided along the transistor TR and the dummy transistor DT. The insulating film 52 is, for example, a silicon oxide film, and the insulating film 53 is, for example, a silicon nitride film.

The insulator 54 is provided on the insulating film 53. The insulator 54 includes a portion provided along the transistor TR and the dummy transistor DT, and is filled between the transistor TR and the dummy transistor DT. Then, the upper surface of the insulator 54 is flattened/planarized. The insulator 54 contains, for example, non-doped silicate glass (NSG).

The insulating film 55 is provided on the insulator 54. In the blocking portion PW, the insulating film 55 includes a portion provided along the divided gate insulating film 60, the conductor layers 61 and 62, the insulator layer 63, the side surfaces of the insulating films 52 and 53, and the P-type well region 20 provided on the bottom of the blocking portion PW. The insulating film 55 on the insulator 54 and the insulating film 55 of the blocking portion PW are provided in a continuous manner, that is, in unbroken and/or uninterrupted manner. The insulating film 55 may be referred to as a continuous film, an unbroken film, and/or a conformal film. The thickness of the insulating film 55 is thicker than the insulating film 53, for example. The insulating film 55 is a silicon nitride film, for example.

The insulator 56 is provided on the insulating film 55. The insulator 56 includes a portion provided along the insulating film 55 in the blocking portion PW, and is filled in the blocking portion PW. Then, the upper surface of the insulator 56 is flattened/planarized. The insulator 56 contains, for example, tetra ethyl ortho silicate (TEOS).

The insulator 57 is provided on the insulator 56 in the peripheral circuit region PR and the boundary region BR, and in the end region of the memory region MR. For example, the insulator 57 is used as an insulator layer for eliminating a step between a structure provided in the memory region MR and a structure provided in the peripheral circuit region PR. The insulator 57 contains, for example, NSG.

The contact CS has a columnar structure extending in the Z-direction, and is provided through the insulating films 52, 53 and 55 and the insulators 54 and 56. The upper surface of the contact CS is in an upper layer than the upper surface of the slit SLT, and the bottom of the contact CS is in contact with the N-type semiconductor region 51. For example, in the junction layer JT, the contact CS has a shape similar to that of the memory pillar MP.

The contact CG has a columnar structure extending in the Z-direction, and is provided through the insulating films 52, 53, and 55, the insulators 54 and 56, and the insulator layer 63. The upper surface of the contact CG is aligned with the upper surface of the contact CS, and the bottom of the contact CS is in contact with the conductor layer 62. For example, in the junction layer JT, the contact CG has a shape similar to the memory pillar MP, similarly to the contact CS.

One conductor layer 29 is provided on each of the contacts CS and CG. The conductor layer 29 is wiring used for controlling the transistor TR. The conductor layer 29 is provided in the same layer as the conductor layer 28, for example. Other contacts and wirings may be connected to each conductor layer 29.

Figure 9:
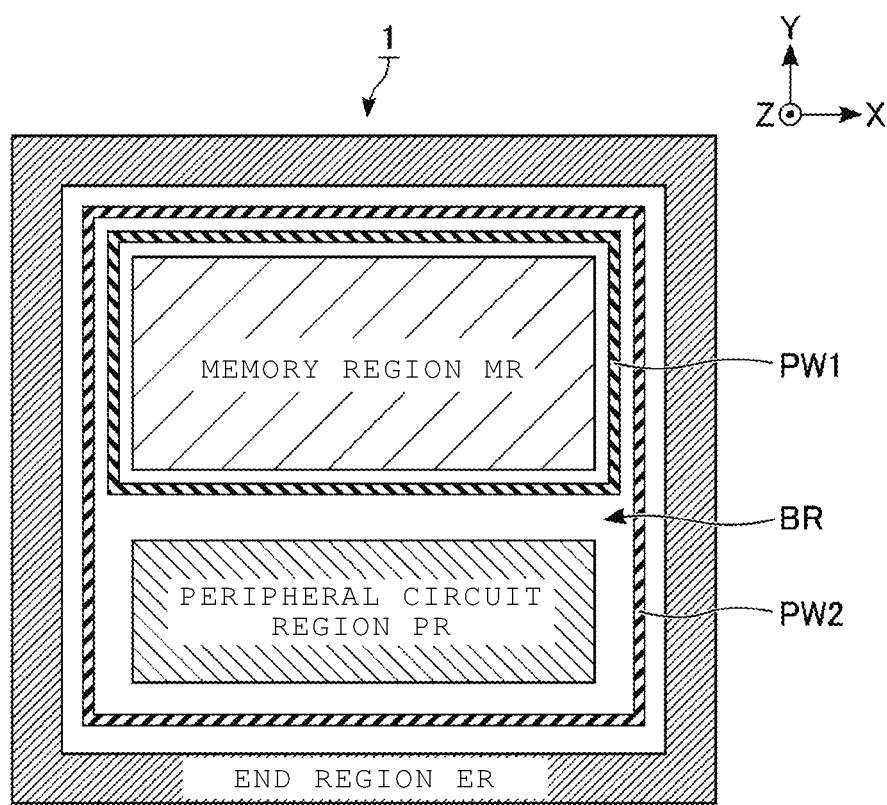
FIG. 9 illustrates a plan view of a blocking portion in the semiconductor memory device according to the first embodiment.

FIG. 9 shows an example of a planar layout of the blocking portion PW in the semiconductor memory device 1 according to the first embodiment. As shown in FIG. 9, in the boundary region BR, the semiconductor memory device 1 includes, for example, two blocking portions PW1 and PW2. The blocking portion PW1 surrounds the periphery of the memory region MR. The blocking portion PW2 surrounds the peripheries of the memory region MR and the peripheral circuit region PR. The blocking portion PW1 is surrounded by, for example, the blocking portion PW2.

In the semiconductor memory device 1 according to the first embodiment, it is sufficient as long as at least one blocking portion PW is provided. In the first embodiment, it is sufficient as long as at least the peripheral circuit region PR, and each of the memory region MR and the end region ER are separated by the blocking portion PW. Further, the planar shape of the blocking portion PW is not limited to a square annular shape, and may be designed to any shape.

[1-2] Manufacturing Method of Semiconductor Memory Device 1

Figure 10:
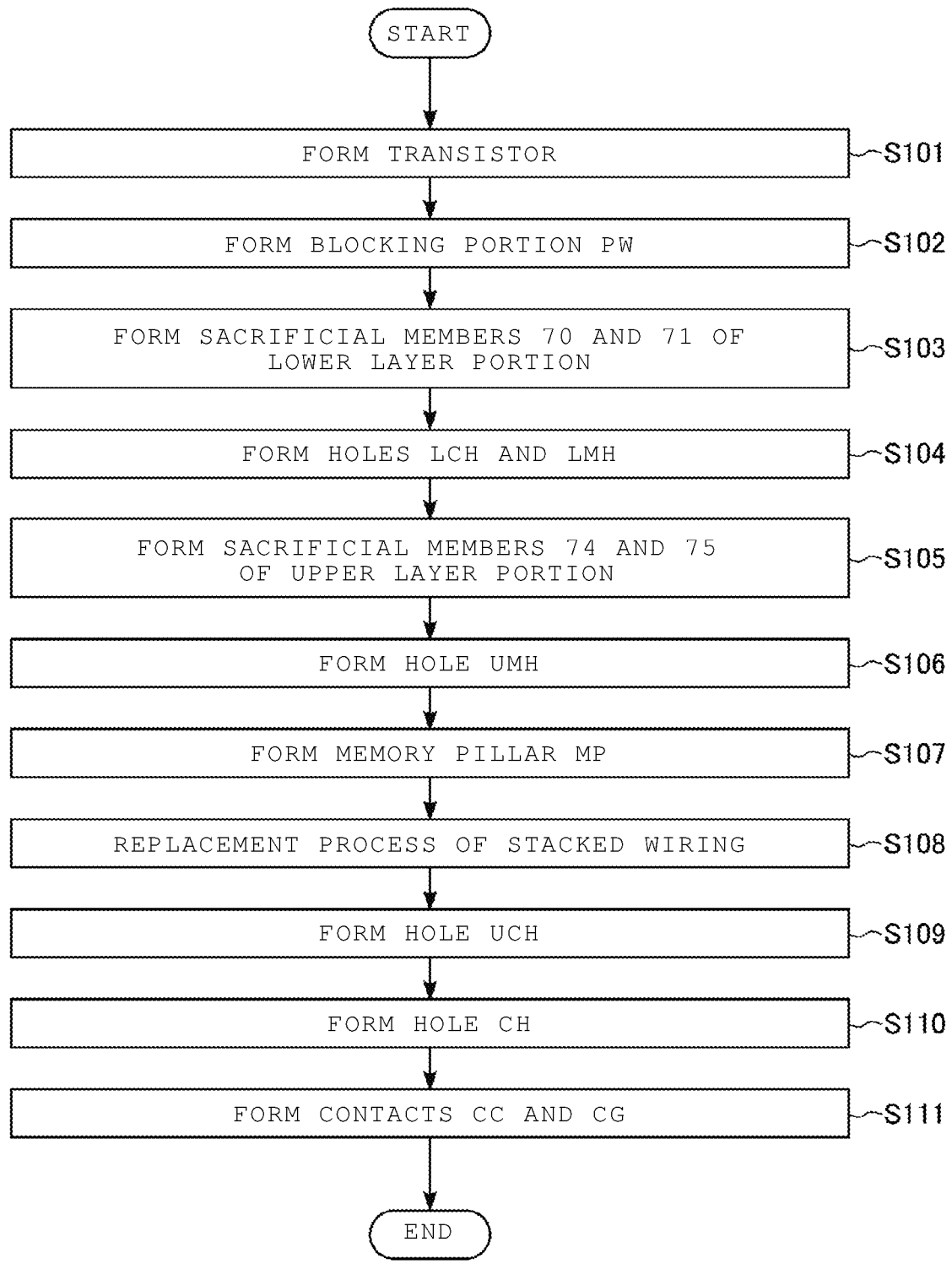
FIG. 10 is a flowchart showing an example of a manufacturing method of the semiconductor memory device according to the first embodiment.

Hereinafter, an example of a series of manufacturing processes from the formation of the transistor TR to the formation of the contact CG in the semiconductor memory device 1 according to the first embodiment will be described with reference to FIG. 10 as appropriate. FIG. 10 is a flowchart showing an example of the manufacturing method of the semiconductor memory device 1 according to the first embodiment. Each of FIGS. 11 to 26 is an example of a cross-sectional structure in the process of manufacturing the semiconductor memory device 1 according to the first embodiment, and shows an extracted part of the memory region MR, the boundary region BR, and the peripheral circuit region PR. In the following description of the manufacturing method, since the manufacturing processes of the contacts CC and CG connected to the transistor TR are similar, the manufacturing method of the contact CG will be described as a representative, and the illustration of the structure related to the contact CS will be omitted.

Figure 11:
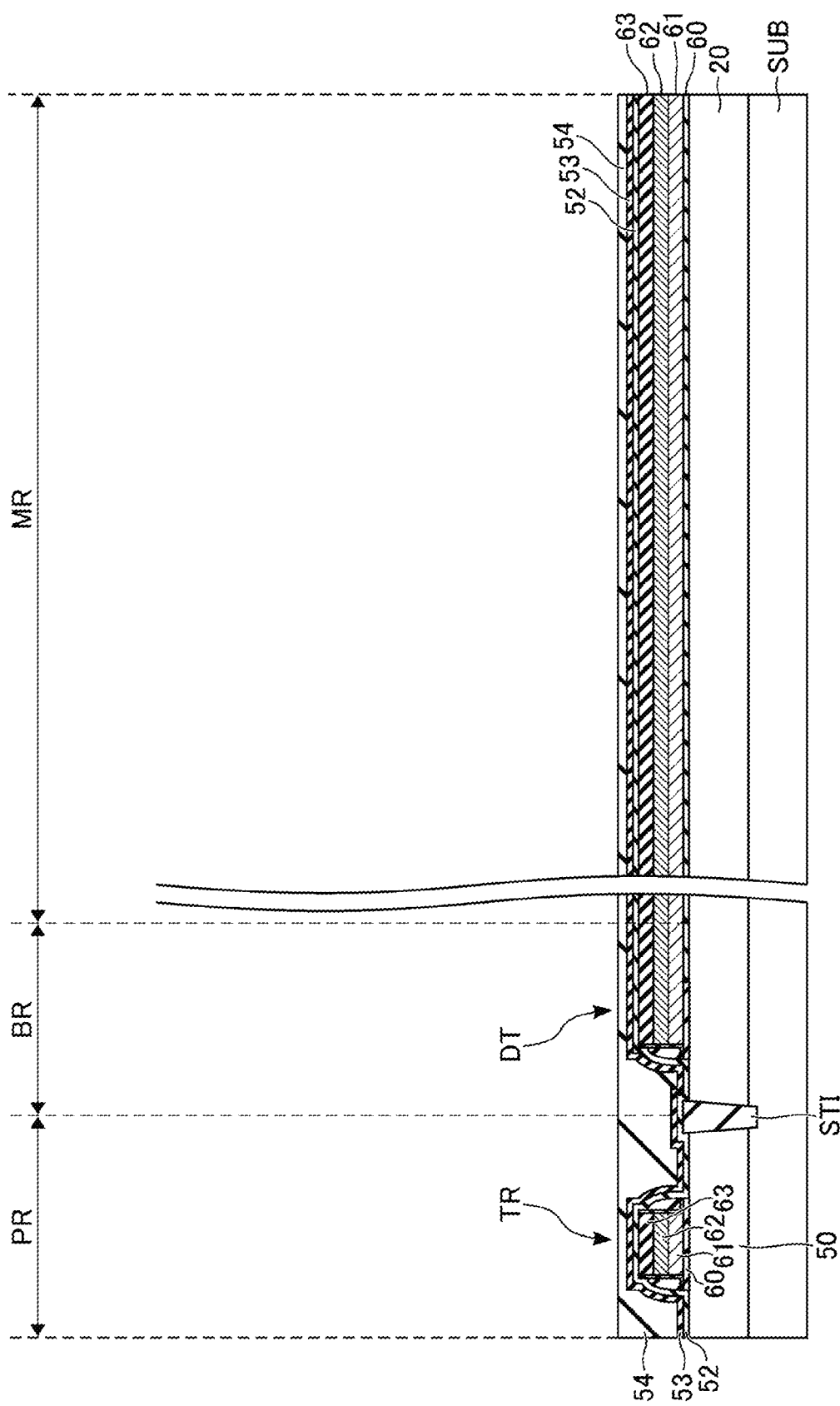
FIGS. 11-26 illustrate cross-sectional views of a structure during a process of manufacturing a semiconductor memory device according to the first embodiment.

First, as shown in FIG. 11, the transistor TR is formed (step S101). Specifically, first, the P-type well regions 20 and 50 are formed on the surface of the semiconductor substrate SUB, and the P-type well regions 20 and 50 are divided by the insulating region STI. Then, the gate insulating film 60, the conductor layers 61 and 62, and the insulator layer 63 are sequentially formed, and the gate insulating film 60, the conductor layers 61 and 62, and the insulator layer 63 are processed according to the shapes of the transistor TR and the dummy transistor DT. Then, an insulator is formed on the side walls of the transistor TR and the dummy transistor DT, and the insulating films 52 and 53 and the insulator 54 are sequentially formed. At this time, a step is formed in the insulator 54 in accordance with the shape of the transistor TR and the dummy transistor DT, and thus the upper surface of the insulator 54 is planarized by, for example, the chemical mechanical polishing (CMP).

Figure 12:
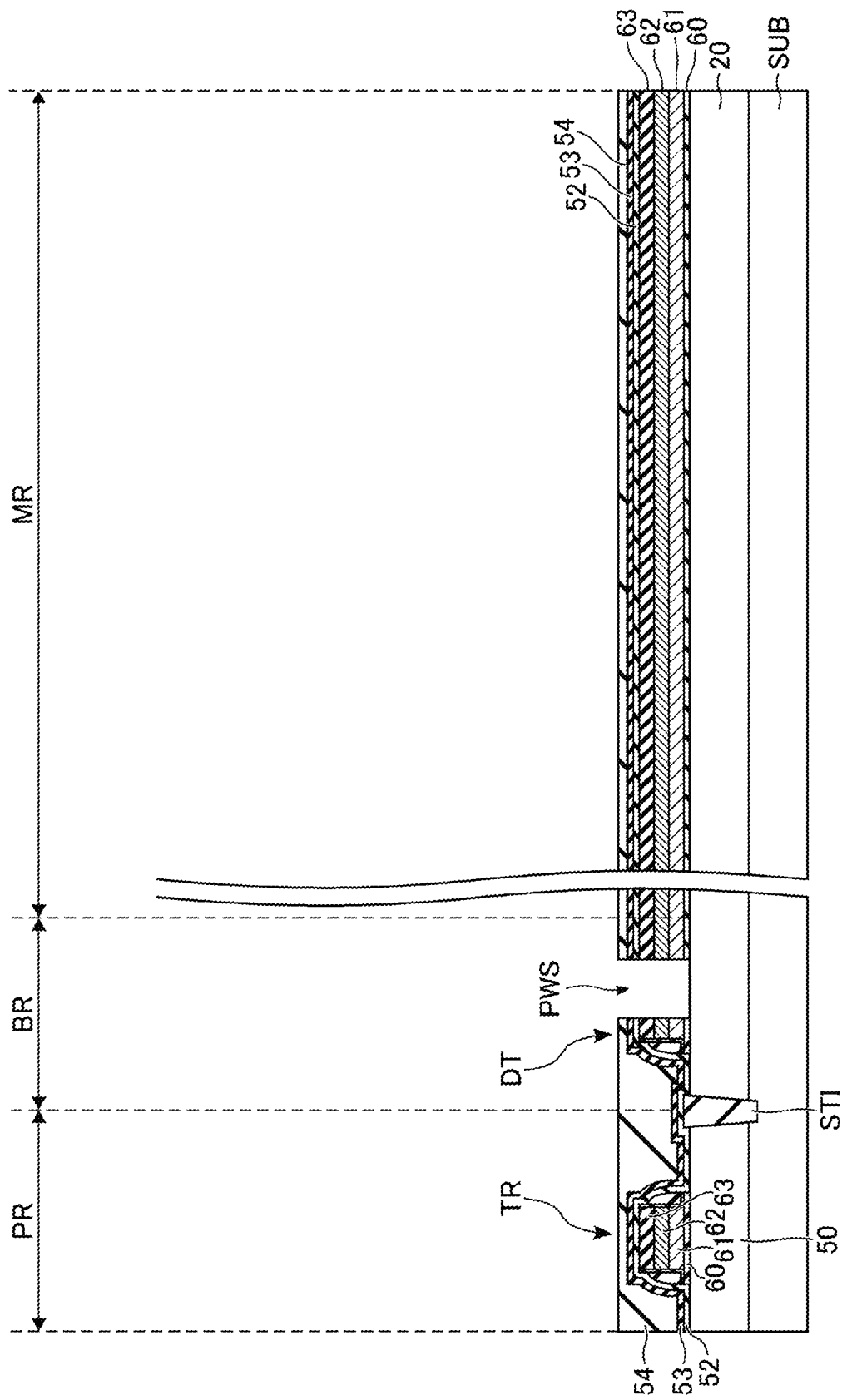

Next, the blocking portion PW is formed (step S102). Specifically, first, a mask having an opening region corresponding to the blocking portion PW in the boundary region BR is formed by photolithography or the like. Then, a slit PWS as shown in FIG. 12 is formed by etching using the mask. The slit PWS divides the gate insulating film 60, the conductor layers 61 and 62, the insulator layer 63, the insulating films 52 and 53, and the insulator 54, and a part of the P-type well region 20 is exposed at the bottom of the slit PWS.

Figure 13:
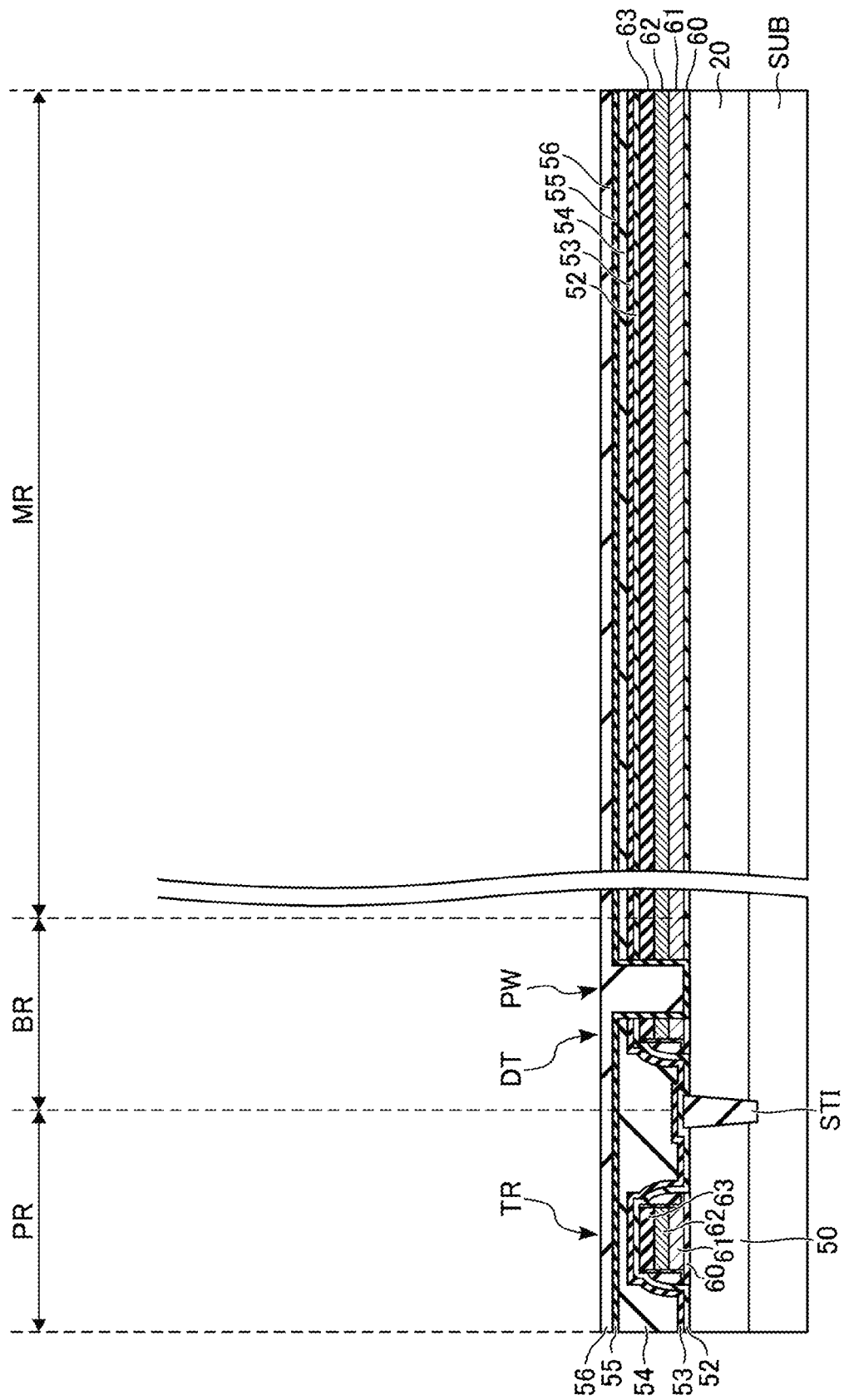

Then, the insulator 56 is formed on the insulating film 55, and the slit PWS is filled with the insulator 56. At this time, since a step is formed according to the shape of the slit PWS, the upper surface of the insulator 56 is planarized by CMP, for example, as shown in FIG. 13.

Figure 14:
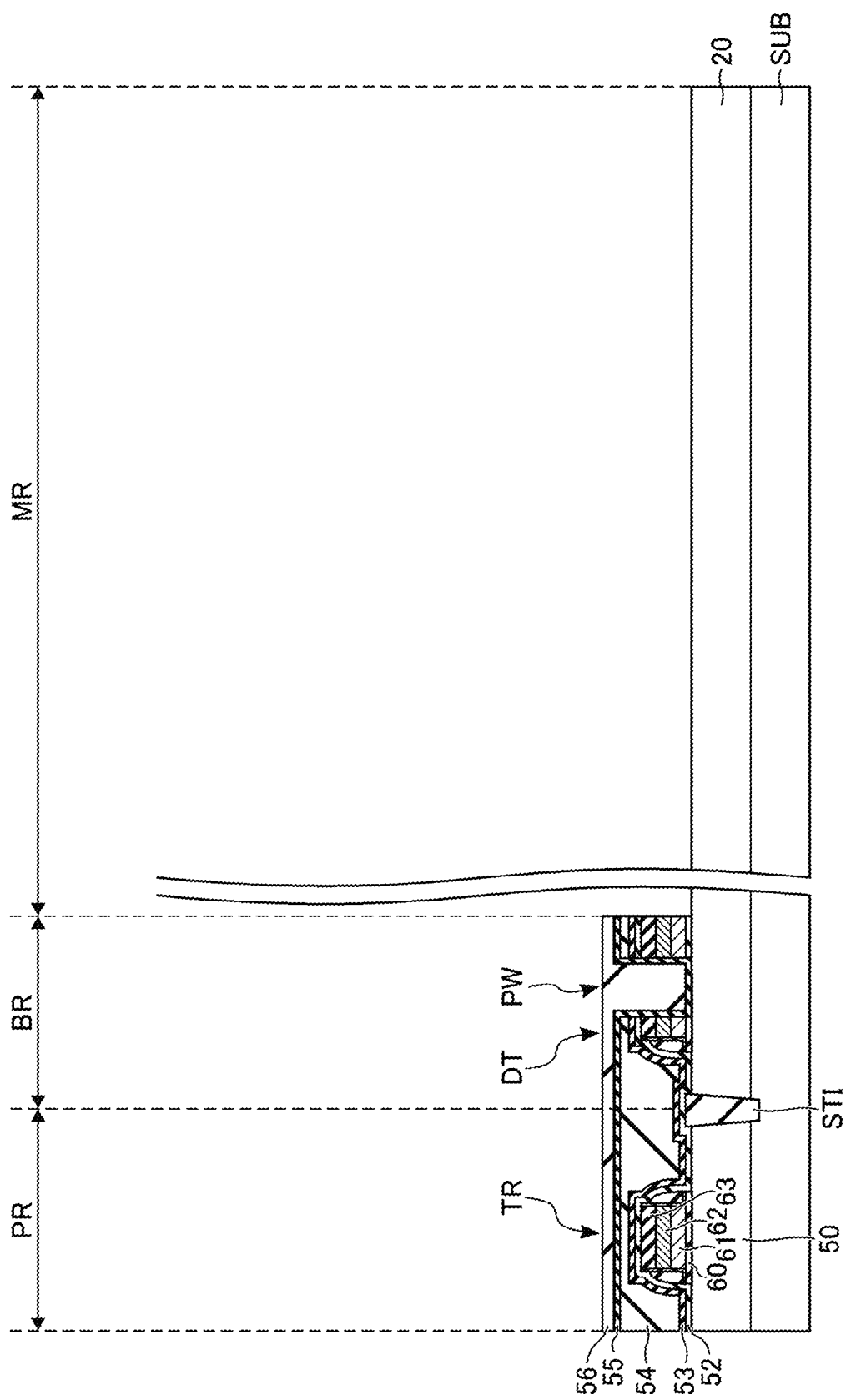

Next, sacrificial members 70 and 71 of the lower layer portion are formed (step S103). Specifically, a mask having an opening in the memory region MR is first formed by photolithography or the like. Then, as shown in FIG. 14, the gate insulating film 60, the conductor layers 61 and 62, the insulator layer 63, the insulating films 52, 53, and 55 and the insulators 54 and 56 in the memory region MR are removed by anisotropic etching using the mask.

Figure 15:
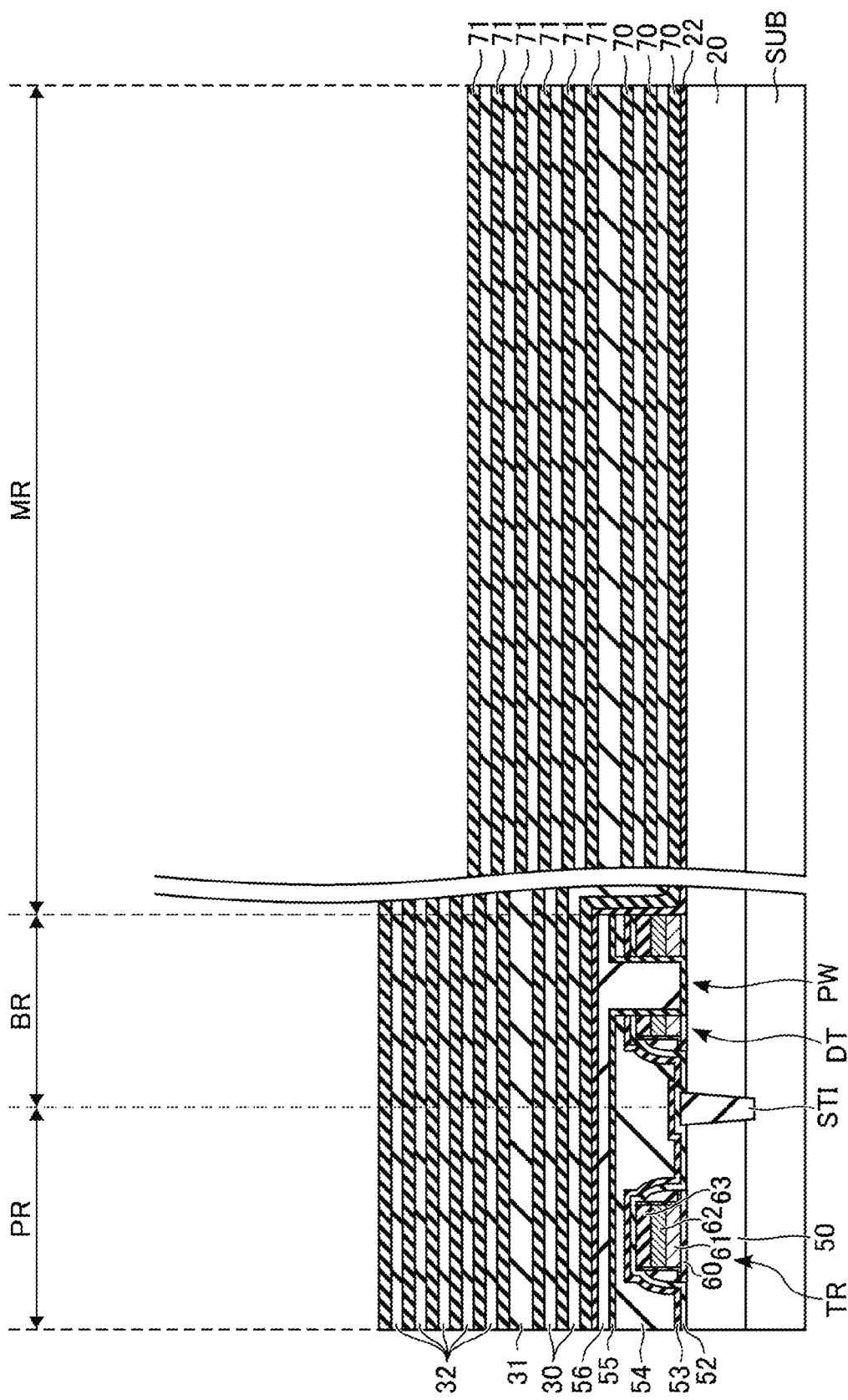

Then, the insulator layer 22 is formed, and the sacrificial members 70 and the insulator layers 30 are alternately stacked on the insulator layer 22. Subsequently, the insulator layer 31 is formed on the uppermost sacrificial member 70, and the sacrificial members 71 and the insulator layers 32 are alternately stacked on the insulator layer 31. As a result, as shown in FIG. 15, the sacrificial members 70 and 71 of the lower layer portion are formed in the memory region MR. In this step, the sacrificial members 70 and 71 are also formed above the transistor TR in the peripheral circuit region PR and above the dummy transistor DT in the boundary region BR.

Figure 16:
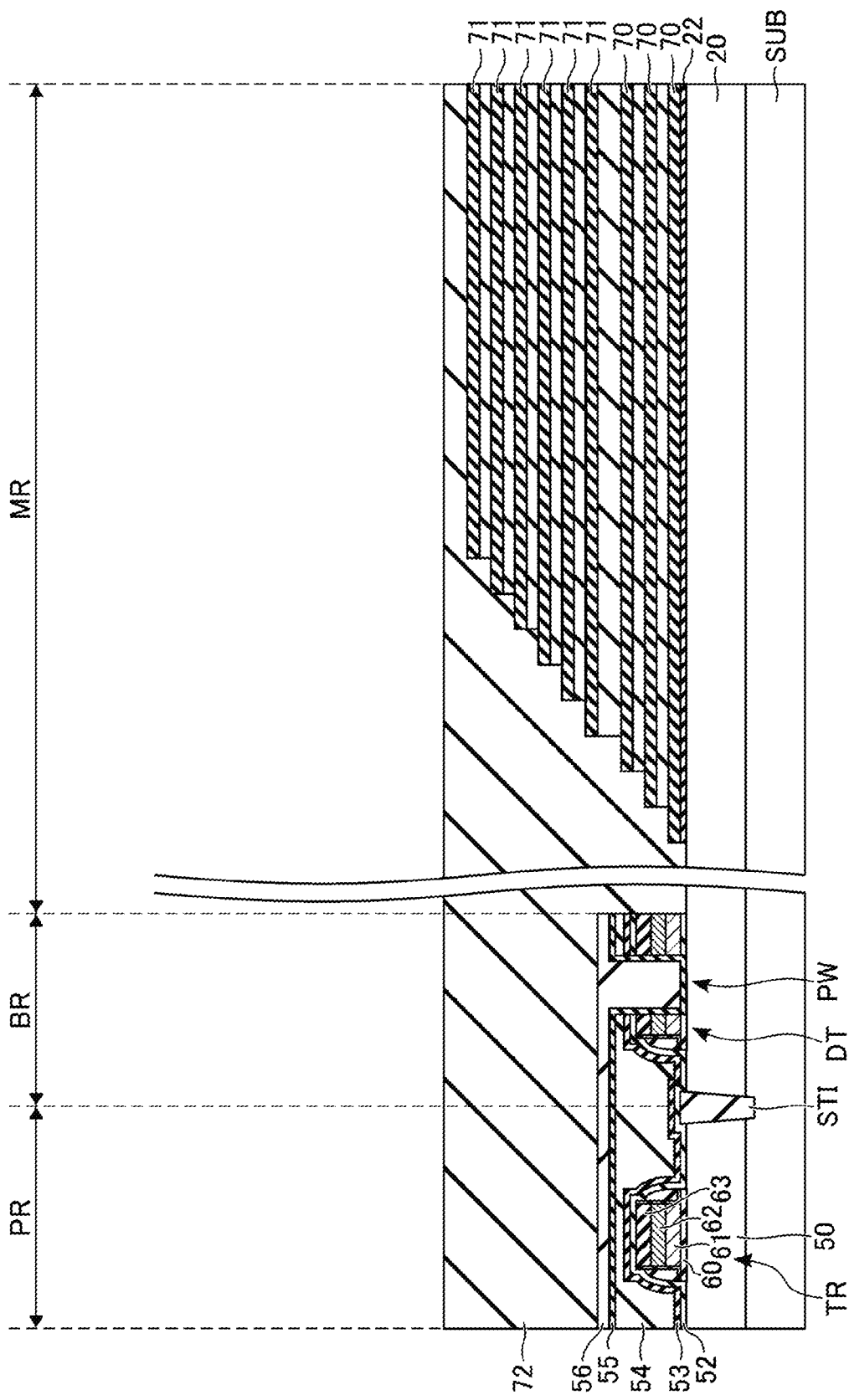

Thereafter, the end portions of the sacrificial members 70 and 71 in the memory region MR are processed into a stepped shape by the step processing of the lower layer portion, and the sacrificial members 70 and 71 in the boundary region BR and the peripheral circuit region PR are removed. Then, the insulator 72 is formed, and the step formed by the step processing of the lower layer portion is buried by the insulator 72, and the upper surface of the insulator 72 is flattened/planarized as shown in FIG. 16.

Figure 17:
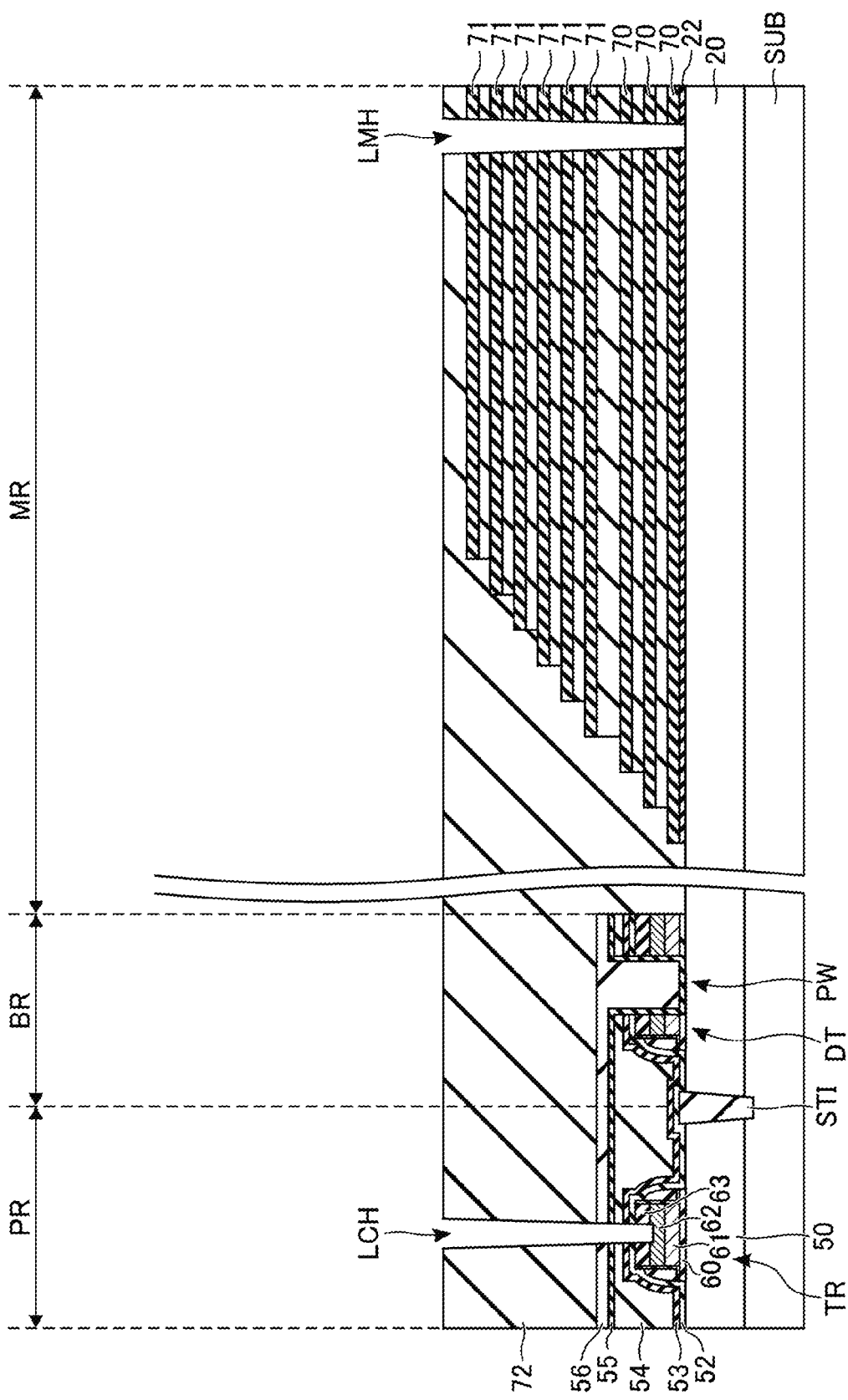
Figure 18:
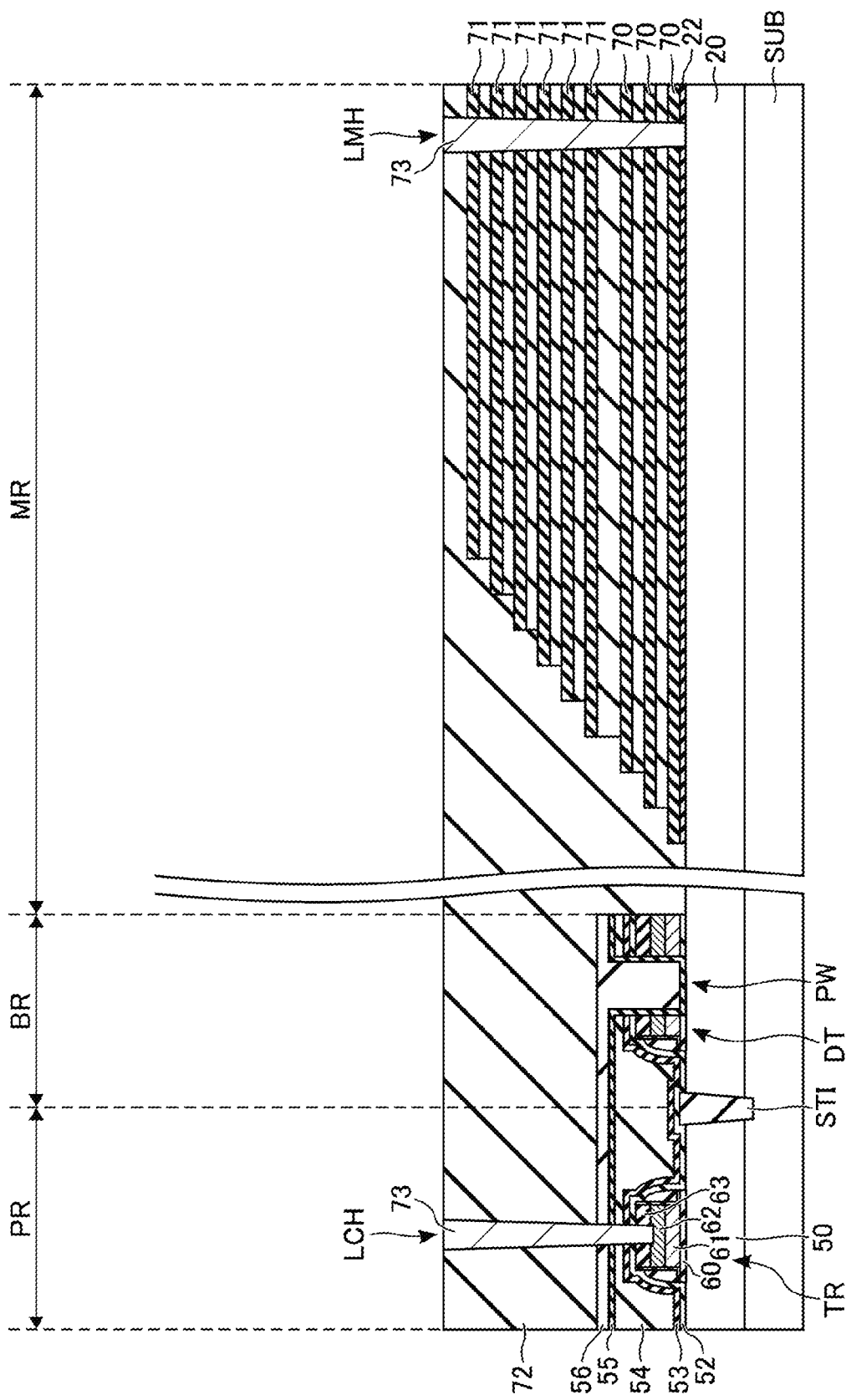

Next, holes LCH and LMH are formed (step S104) Specifically, first, a mask having an opening region corresponding to the contact CG and the memory pillar MP is formed by photolithography or the like. Then, a hole LCH corresponding to the contact CG and a hole LMH corresponding to the memory pillar MP are formed as shown in FIG. 17 by anisotropic etching using the mask. The hole LCH penetrates the insulator layer 63, the insulating films 52, 53, and 55, and the insulators 54, 56, and 72, and a part of the conductor layer 62 is exposed at the bottom of the hole LCH. The hole LMH penetrates the insulator layer 22, the sacrificial members 70 and 71, and the insulator 72, and a part of the P-type well region 20 is exposed at the bottom of the hole LMH. Then, as shown in FIG. 18, the holes LCH and LMH are filled with a sacrificial member 73.

Figure 19:
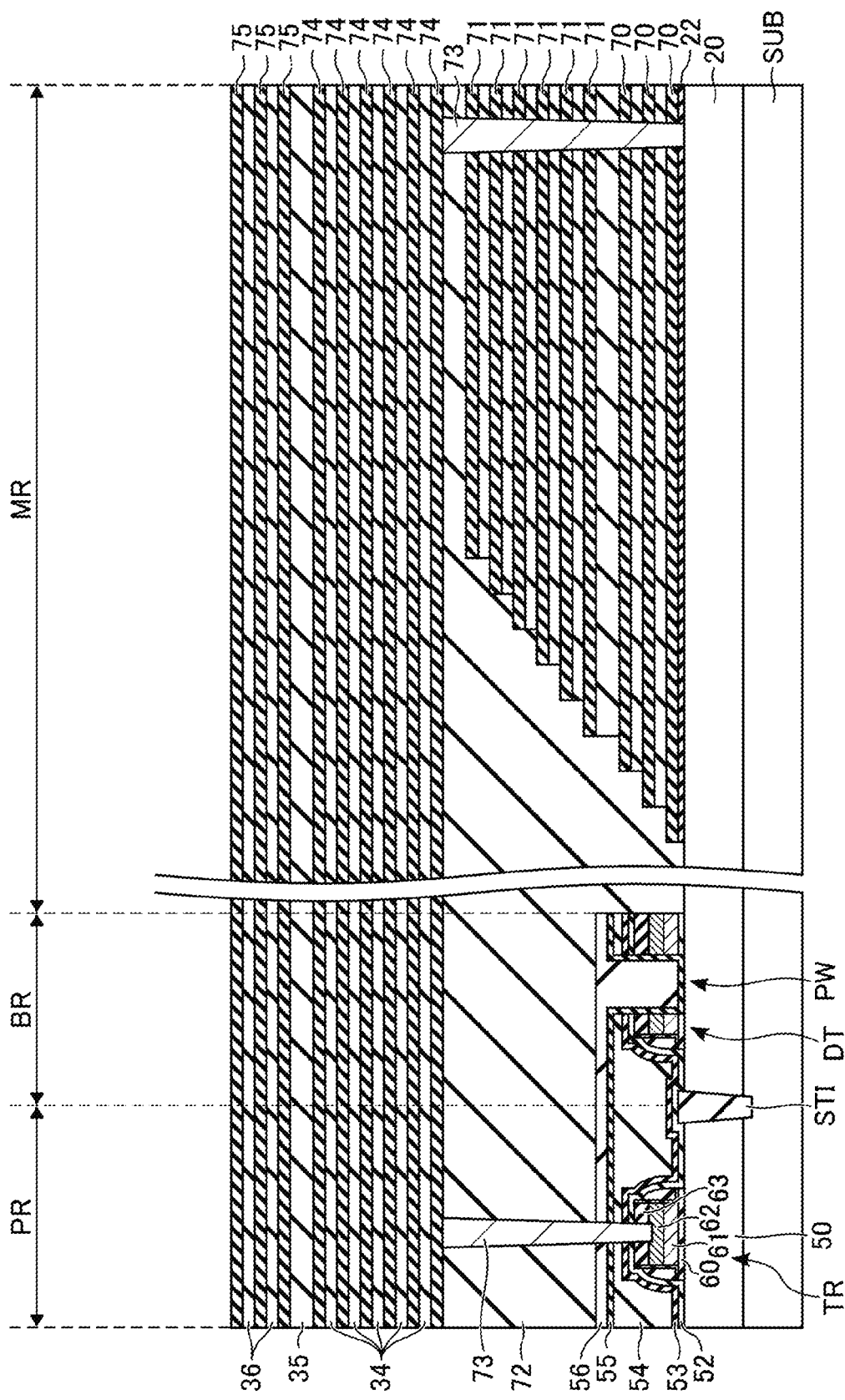

Next, sacrificial members of the upper layer portion are formed (step S105). Specifically, sacrificial members 74 and the insulator layers 34 are alternately stacked on the insulator 72 and the sacrificial member 73. Subsequently, the insulator layer 35 is formed on the uppermost sacrificial member 74, and sacrificial members 75 and the insulator layers 36 are alternately stacked on the insulator layer 35. As a result, as shown in FIG. 19, the sacrificial members 74 and 75 of the upper layer portion are formed in the memory region MR. In this step, the sacrificial members 74 and 75 are also formed above the transistor TR in the peripheral circuit region PR and above the dummy transistor DT in the boundary region BR.

Figure 20:
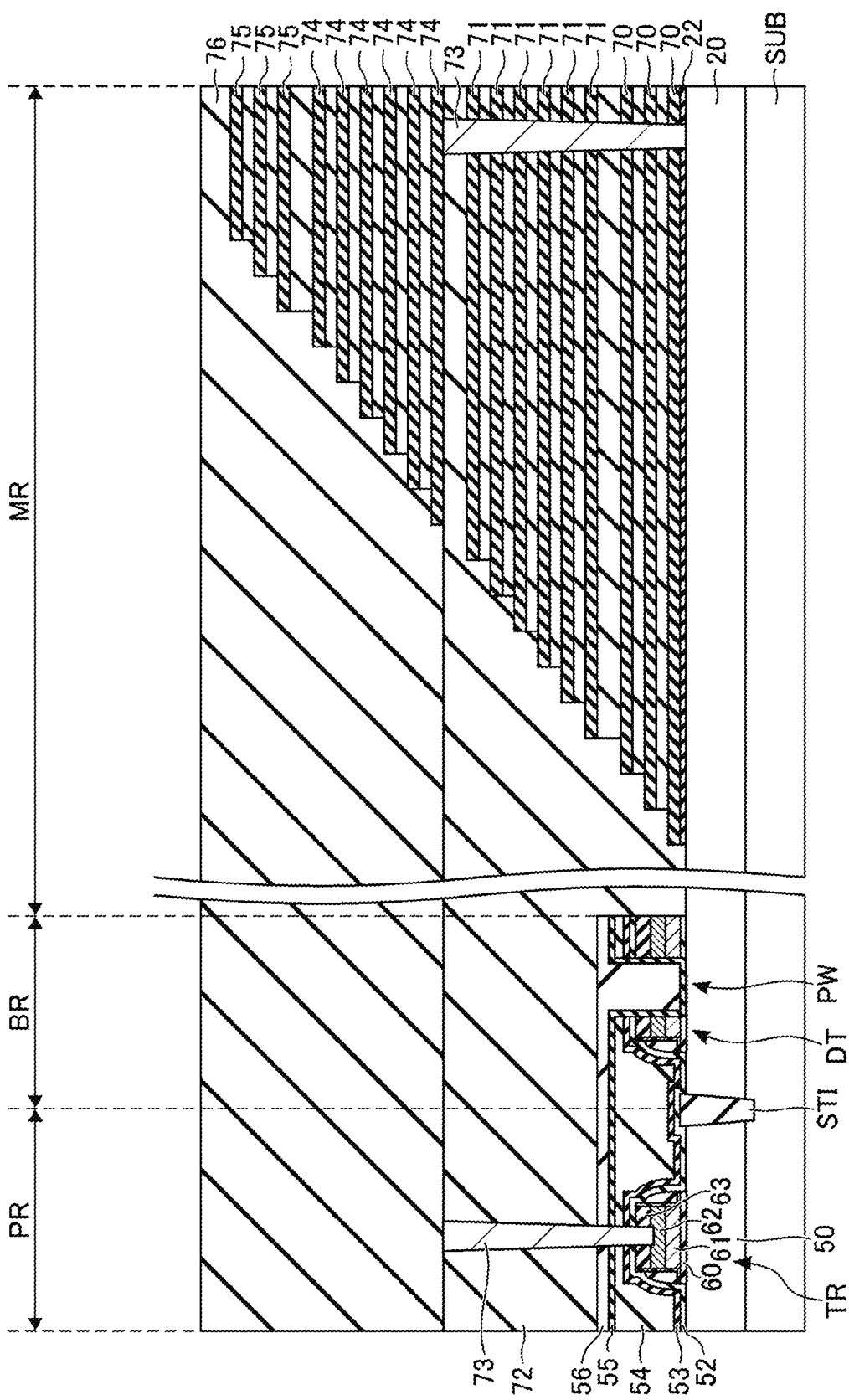

Thereafter, the end portions of the sacrificial members 74 and 75 in the memory region MR are processed into a stepped shape by the step processing of the upper layer portion, and the sacrificial members 74 and 75 in the boundary region BR and the peripheral circuit region PR are removed. Then, an insulator 76 is formed, and the step formed by the step processing of the upper layer portion is buried with the insulator 76, and the upper surface of the insulator 76 is flattened/planarized as shown in FIG. 20.

Figure 21:
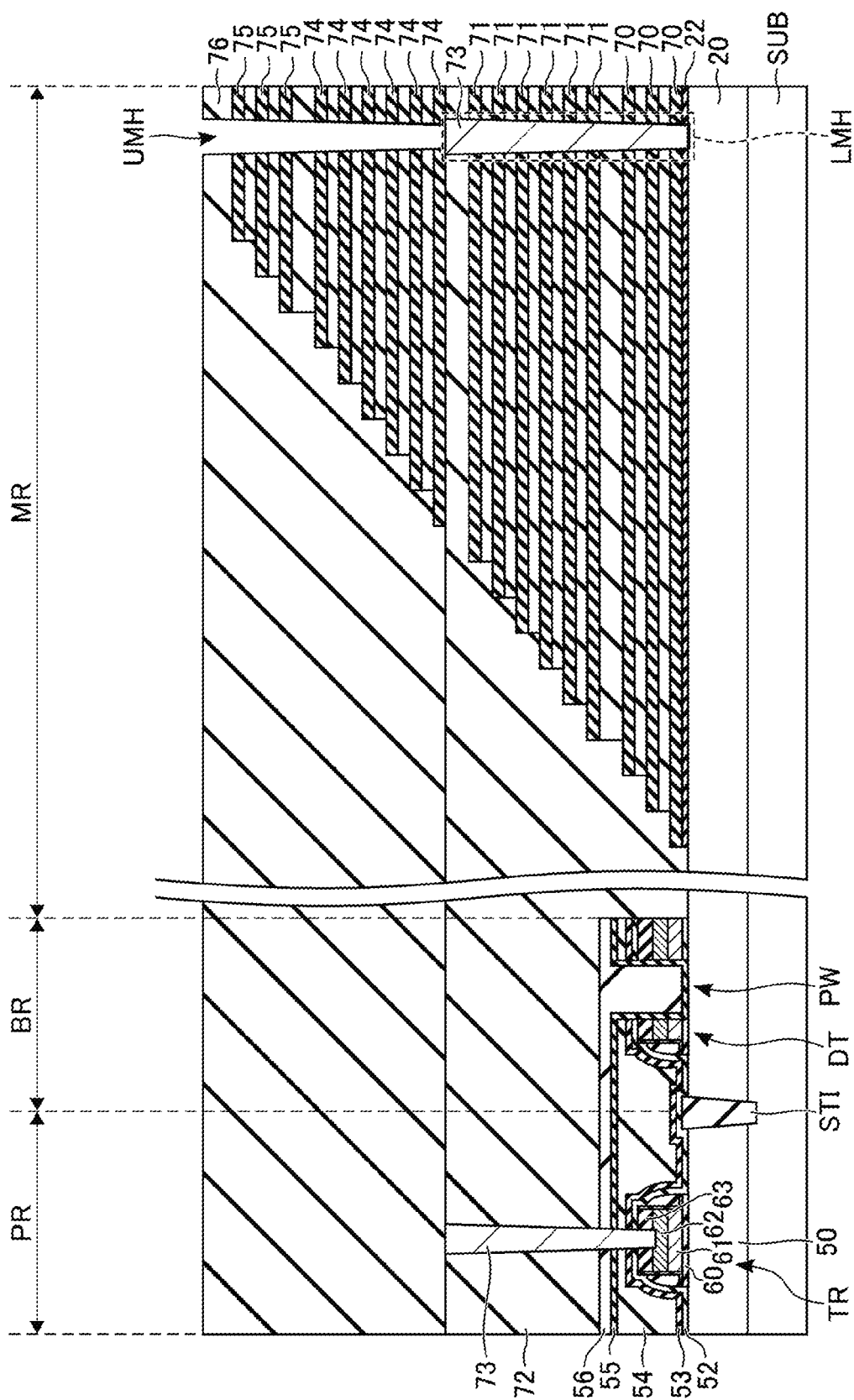

Next, the hole UMH is formed (step S106). Specifically, first, a mask having an opening region corresponding to the memory pillar MP is formed by photolithography or the like. Then, the hole UMH corresponding to the memory pillar MP as shown in FIG. 21 is formed by anisotropic etching using the mask. The hole UMH penetrates the sacrificial members 74 and 75 and the insulator 76, and a part of the sacrificial member 73 in the hole LMH is exposed at the bottom of the hole UMH.

Figure 22:
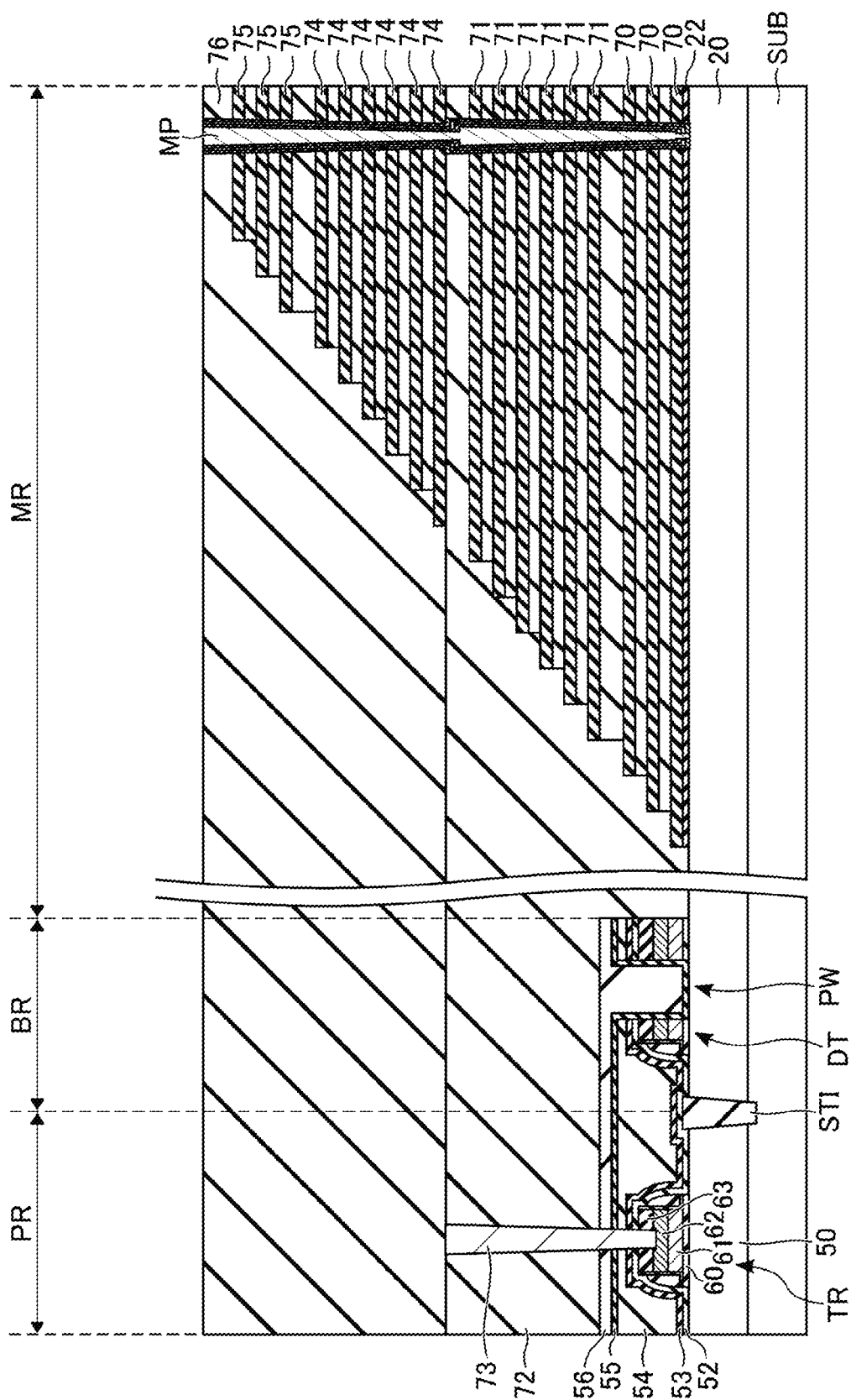

Next, the memory pillar MP is formed (step S107) Specifically, first, the sacrificial member 73 in the hole LMH is removed through the hole UMH by wet etching. Then, the block insulating film 43, the insulating film 42, and the tunnel insulating film 41 are sequentially formed on the side and bottom surfaces of the connected holes LMH and UMH. Thereafter, the block insulating film 43, the insulating film 42, and the tunnel insulating film 41 at the bottom of the hole LMH are partially removed, and the holes LMH and UMH are filled with the semiconductor layer 40. As a result, as shown in FIG. 22, the memory pillar MP is formed in the connected holes LMH and UMH.

Next, the replacement process of the stacked wiring is executed (step S108). Specifically, first, an insulator layer 77 is formed on the insulator 76. Then, a mask having an opening region corresponding to the slit SLT is formed by photolithography or the like, and the slit SLT is formed by anisotropic etching using the mask. The slit SLT divides the sacrificial members 70, 71, 74, and 75, the insulator 76, and the insulator layer 77. Then, the sacrificial members 70, 71, 74, and 75 are selectively removed through the slits SLT, for example, by wet etching using hot phosphoric acid. At this time, the three-dimensional structure of the structure from which the sacrificial members 70, 71, 74, and 75 are removed is maintained by the memory pillar MP or the like.

Then, a conductor is filled through the slit SLT in the space from which the sacrificial members 70, 71, 74, and 75 are removed. For example, the chemical vapor deposition (CVD) is used for forming the conductor in this step. Thereafter, the conductor formed inside the slit SLT is removed by an etch-back process. In this step, it is sufficient as long as the conductors formed in the adjacent wiring layers are separated at least in the slit SLT.

Figure 23:
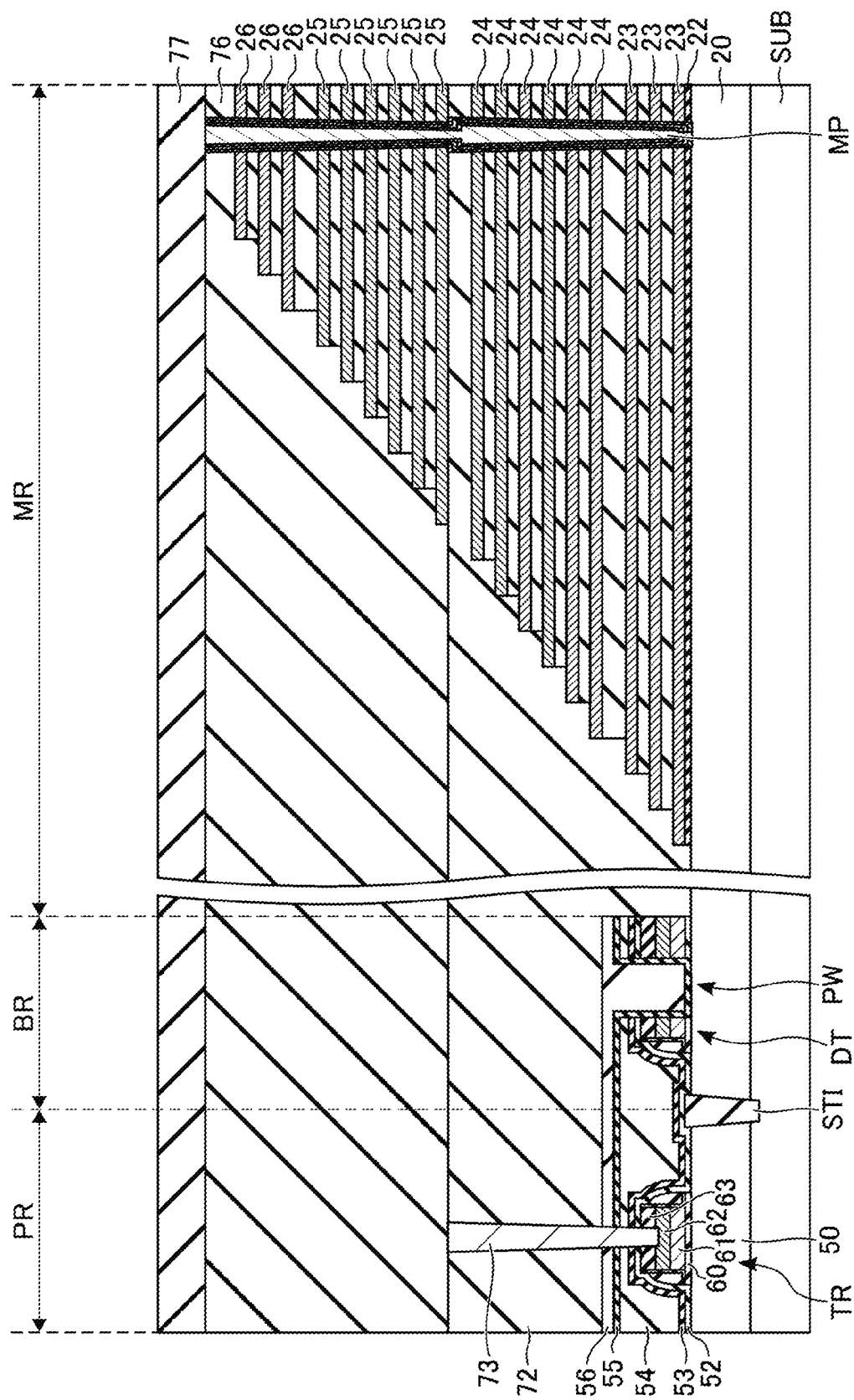

Accordingly, as shown in FIG. 23, the conductor layer 23 functioning as the select gate line SGS, the plurality of conductor layers 24 functioning as the word lines WL0 to WL5, and the plurality of conductor layers 25 functioning as the word lines WL6 to WL11, and the conductor layer 26 functioning as the select gate line SGD are formed. The conductor layers 23 to 26 formed in this step may contain a barrier metal. In this case, after removing the sacrificial members 70, 71, 74, and 75, for example, titanium nitride is formed as a barrier metal, and then tungsten is formed.

Figure 24:
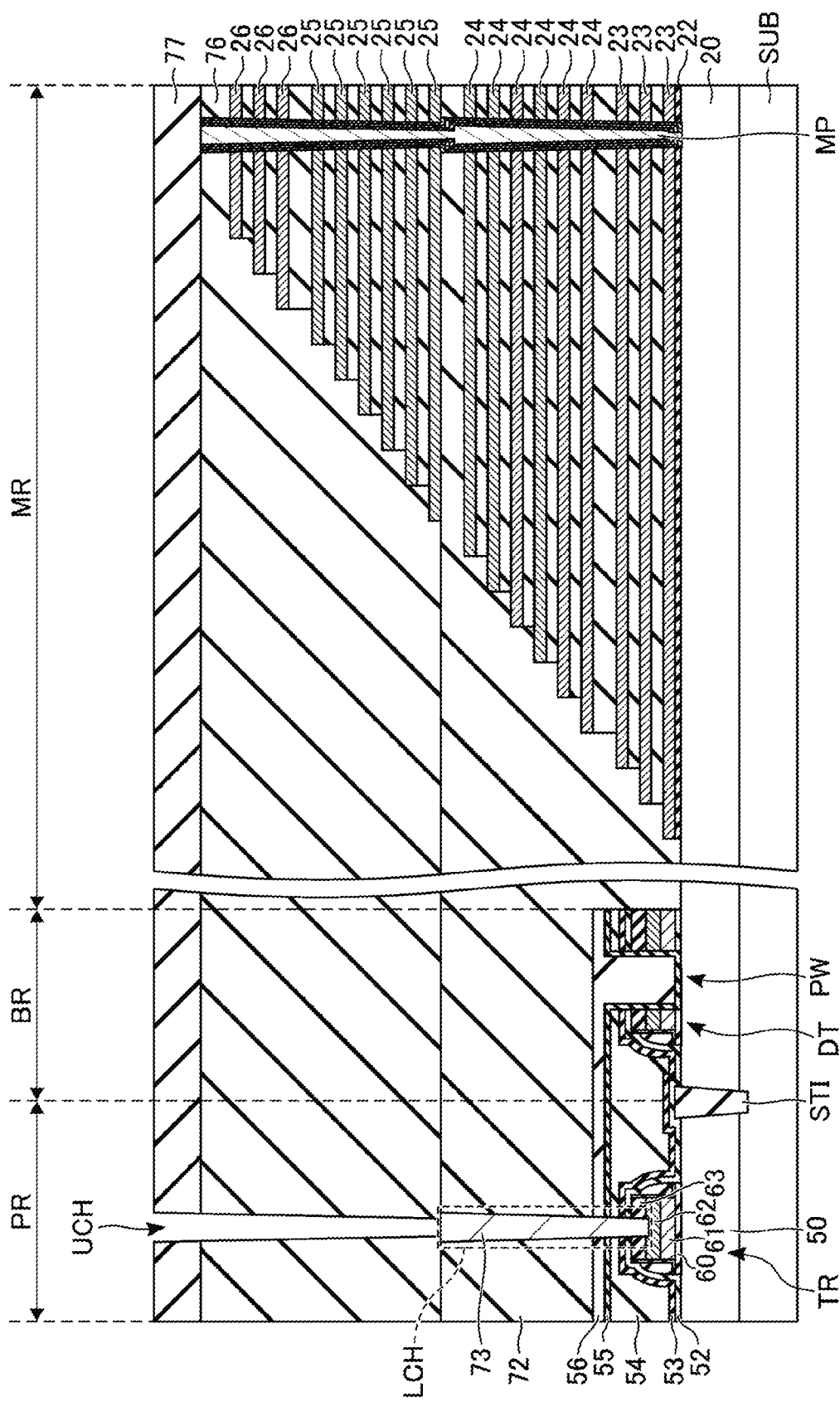

Next, the hole UCH is formed (step S109). Specifically, first, a mask having an opening region corresponding to the contact CG is formed by photolithography or the like. Then, the hole UCH corresponding to the contact CG as shown in FIG. 24 is formed by anisotropic etching using the mask. The hole UCH penetrates the insulator 76 and the insulator layer 77, and a part of the sacrificial member 73 in the hole LCH is exposed at the bottom of the hole UCH.

Figure 25:
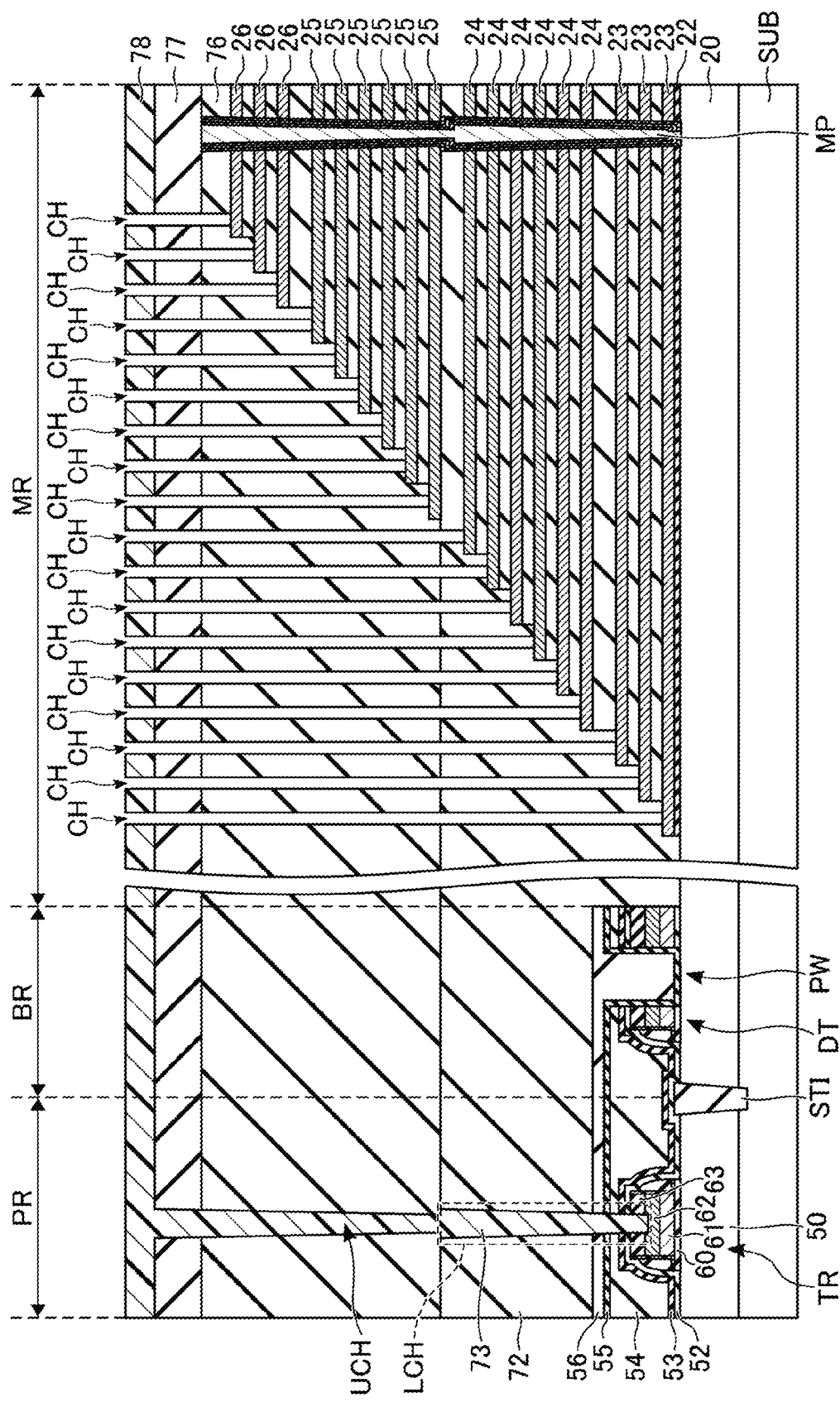

Next, a hole CH is formed (step S110). Specifically, first, the sacrificial member 73 in the hole LCH is removed through the hole UCH by wet etching. Then, a mask 78 is formed on the insulator layer 77 so that, for example, the holes LCH and UCH are buried. The mask 78 is, for example, a resist. Then, in the mask 78, a region corresponding to the contact CC is opened by photolithography or the like. Thereafter, the hole CH corresponding to the contact CC as shown in FIG. 25 is formed by anisotropic etching using the mask. The hole CH penetrates, for example, the insulators 72 and 76, the insulator layer 77, and the mask 78, and any one of the terrace portions of the conductor layers 23 to 26 whose ends are processed into a stepped shape is exposed at the bottom of the hole CH.

Figure 26:
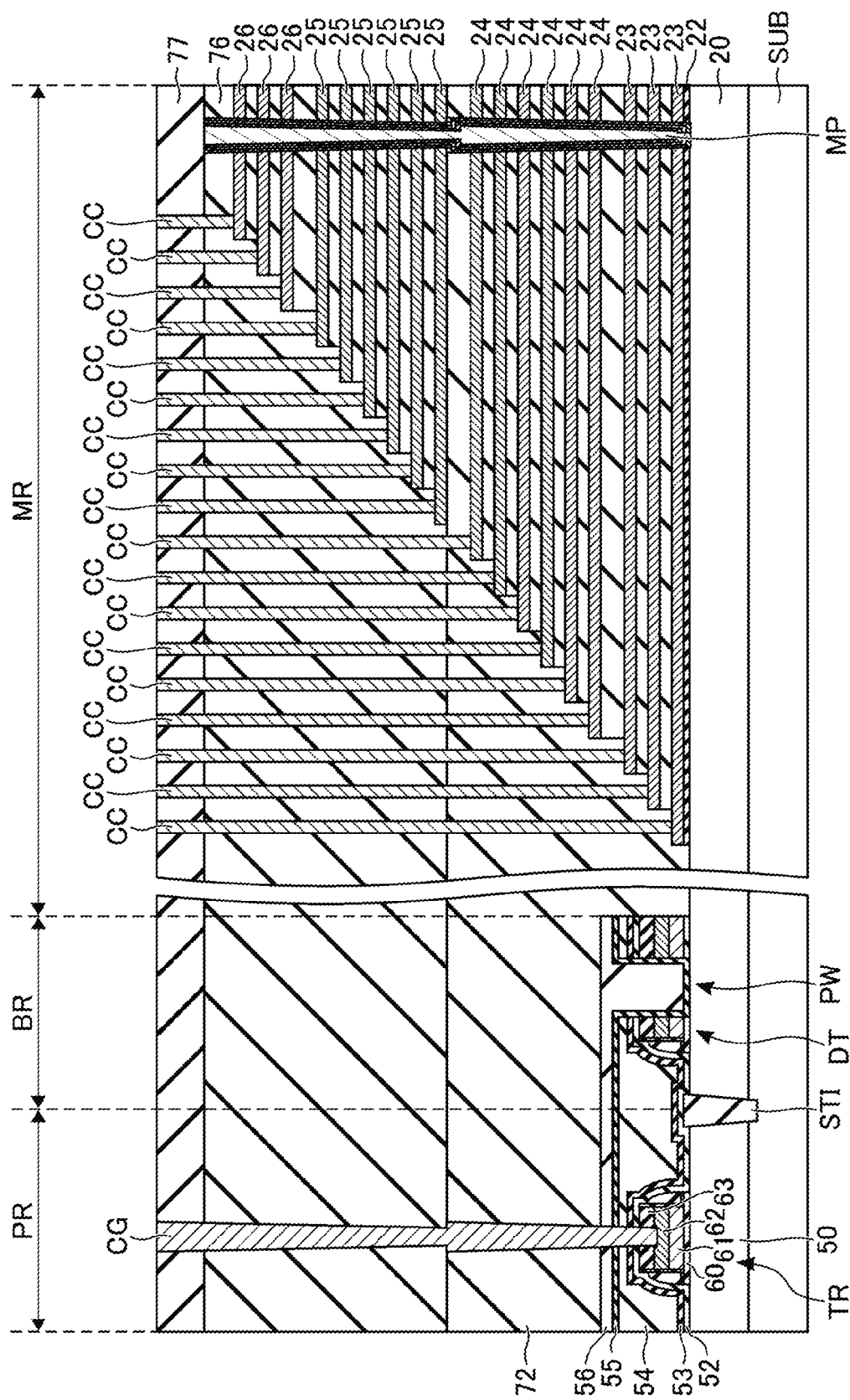

Next, contacts CC and CG are formed (step S111) Specifically, first, the mask 78 on the insulator layer 77 and the mask 78 in the holes UCH and LCH are selectively removed by wet processing. Thereafter, a conductor is formed on the insulator layer 77, and the holes UCH and LCH and the hole CH are filled with the conductor. Then, the conductors formed outside the holes UCH, LCH, and CH are removed. As a result, as shown in FIG. 26, the contact CG is formed in the connected holes LCH and UCH, and the contact CC is formed in the hole CH.

Through the manufacturing process of the semiconductor memory device 1 according to the first embodiment described above, the transistor TR, the dummy transistor DT, the blocking portion PW, the word lines WL, the select gate lines SGD and SGS, and the like are formed. The method for forming the contact CS whose description has been omitted is substantially the same as the method for forming the contact CG except that a hole exposing a part of the N-type semiconductor region 51 is formed in step S104.

In addition, the manufacturing process described above is merely an example, and the processing content may be divided, a manufacturing process may be replaced in the possible range, and another process may be inserted between each manufacturing process. Moreover, although the case where the holes LMH and LCH are collectively formed is illustrated, the holes LMH and LCH may be formed in separate steps. In the formation of the hole LCH, the bottom of the hole LCH may be stopped in the insulator layer 63. In this case, a part of the insulator layer 63 at the bottom of the hole LCH is removed before the contact CG is formed. The same applies to the contact CS, and the bottom of the hole formed simultaneously with the hole LCH and corresponding to the contact CS may be stopped by another layer.

[1-3] Effects of First Embodiment

According to the semiconductor memory device 1 according to the first embodiment described above, the yield of the semiconductor memory device can be improved. Hereinafter, detailed effects of the semiconductor memory device 1 according to the first embodiment will be described using a comparative example.

In the semiconductor memory device in which memory cells are three-dimensionally stacked, for example, the peripheral circuit (hereinafter referred to as a CMOS portion) that controls the memory cell array is formed, and then the stacked wiring of the memory cell array is formed. The stacked wiring may be a hydrogen generation source in the formation process thereof. Such hydrogen may be a cause of the performance degradation of the transistor in the CMOS portion, and may be a cause of yield reduction.

Figure 27:
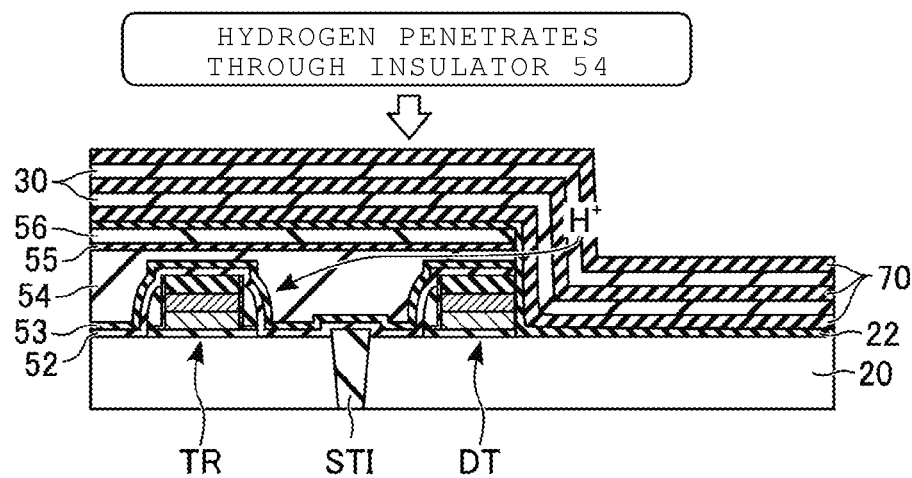
FIG. 27 illustrates a cross-sectional view of a hydrogen penetration path in the manufacturing process of a semiconductor memory device according to a comparative example of the first embodiment.

FIG. 27 shows an example of a cross section including the peripheral circuit region PR of the semiconductor memory device according to a comparative example of the first embodiment. Further, FIG. 27 shows a state where the transistor structure in the memory region MR is removed after the CMOS portion is formed, and the insulator layer 22, the sacrificial member 70, and the insulator layer 30 are stacked. Hereinafter, the stacked structure of the sacrificial member 70 and the like is referred to as a stacked wiring portion.

As shown in FIG. 27, in the semiconductor memory device according to the comparative example of the first embodiment, the blocking portion PW is omitted unlikely to the embodiment, and the semiconductor memory device has a structure in which the insulating film 55 is provided only above the transistor TR and the dummy transistor DT. The insulating film 55 is, for example, a silicon nitride film, and can block hydrogen generated in the stacked wiring portion.

However, in the semiconductor memory device according to the comparative example of the first embodiment, the end portion of the insulator 54 through which hydrogen can permeate is in contact with the stacked wiring portion. That is, in the comparative example, hydrogen (H$^+$) generated in the stacked wiring portion penetrates into the vicinity of the transistor TR through the insulator 54 between the dummy transistor DT and the stacked wiring portion, and there is a risk that the performance of the transistor TR decreases.

Figure 28:
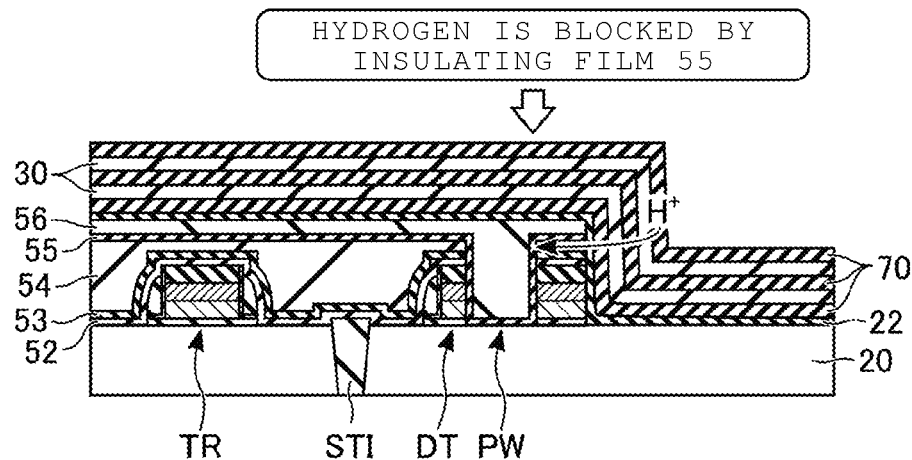
FIG. 28 illustrates a cross-sectional view of a hydrogen penetration path in the manufacturing process of the semiconductor memory device according to the first embodiment.

In contrast, the semiconductor memory device 1 according to the first embodiment has a structure in which the structure of the dummy transistor DT is divided by the insulating film 55 (blocking portion PW). FIG. 28 is an example of a cross section including the peripheral circuit region PR of the semiconductor memory device 1 according to the first embodiment, and shows the same region as FIG. 27.

As shown in FIG. 28, in the semiconductor memory device 1 according to the first embodiment, the insulating film 55 of the blocking portion PW is in contact with the surface of the semiconductor substrate SUB and covers the side surface of the divided portion of the dummy transistor DT. The blocking portion PW separates the memory region MR and the peripheral circuit region PR. That is, in the first embodiment, the transistor TR in the CMOS portion is surrounded by the insulating film 55, and the insulator 54 provided around the transistor TR and the stacked wiring portion are separated via the insulating film 55.

In the semiconductor memory device 1 according to the first embodiment, the insulating film 55 can block hydrogen generated during the formation of the stacked wiring portion. In other words, the insulating film 55 can block the hydrogen penetration path from the stacked wiring portion to the CMOS portion. As a result, the semiconductor memory device 1 according to the first embodiment is more likely to suppress performance degradation of the transistor TR due to hydrogen generated in the stacked wiring portion, and can improve the yield.

A structure such as a stacked wiring portion may also be formed in the end region ER. That is, the end region ER is also considered as a hydrogen generation source. On the other hand, the semiconductor memory device 1 according to the first embodiment includes the blocking portion PW2 between the peripheral circuit region PR and the end region ER. For that reason, the semiconductor memory device 1 according to the first embodiment can also block hydrogen generated in the end region ER by the insulating film 55.

[2] Second Embodiment

The semiconductor memory device 1 according to a second embodiment has a blocking portion PW including a plurality of concave structures that divide the dummy transistor DT. The following describes differences of the semiconductor memory device 1 according to the second embodiment from the first embodiment.

[2-1] Configuration of Semiconductor Memory Device 1

Figure 29:
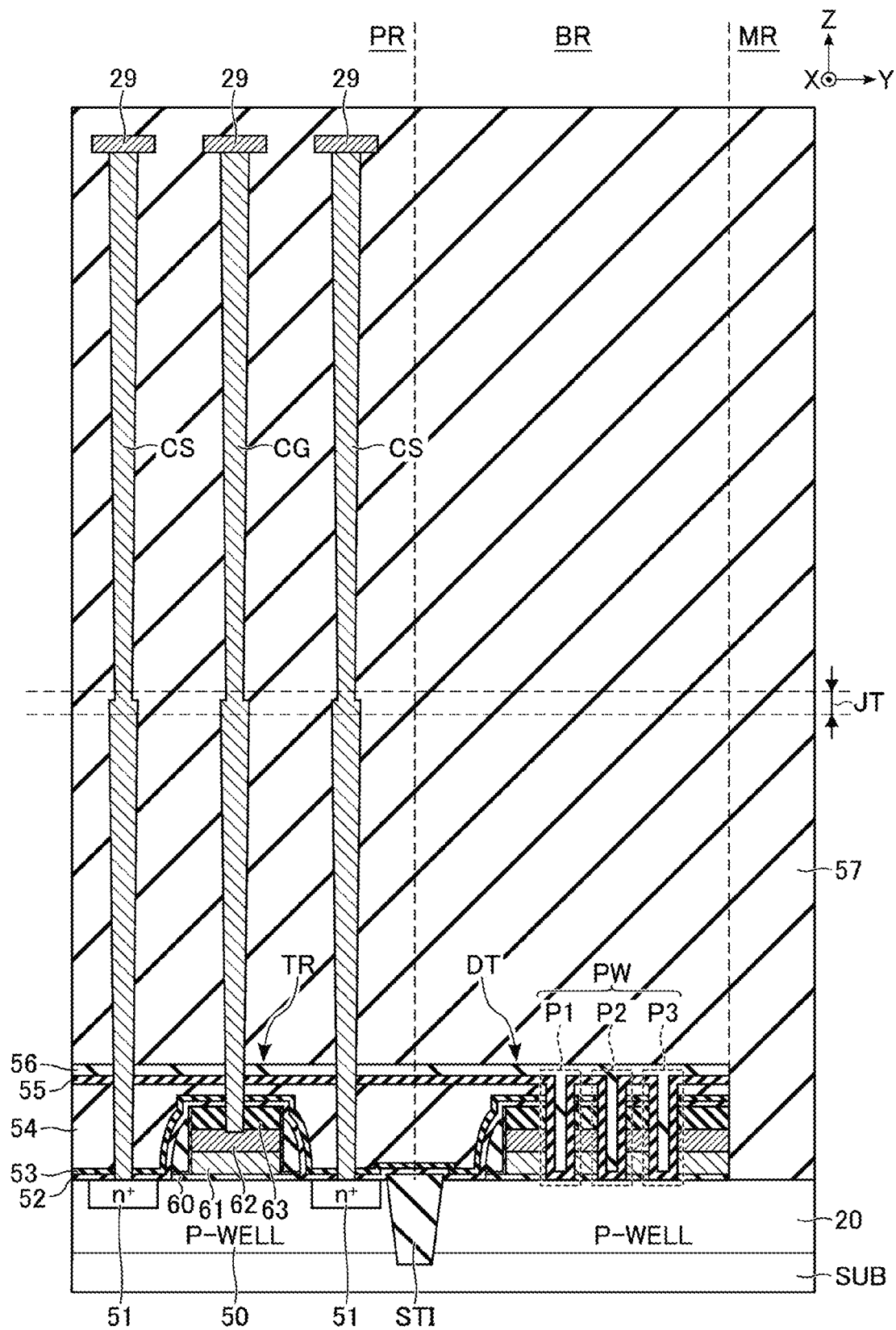
FIG. 29 illustrates a cross-sectional view of a peripheral circuit region of a semiconductor memory device according to a second embodiment.

FIG. 29 shows an example of a cross-sectional structure in the peripheral circuit region PR of the semiconductor memory device 1 according to the second embodiment, and shows a region similar to FIG. 8 described in the first embodiment. As shown in FIG. 29, the semiconductor memory device 1 according to the second embodiment differs from the first embodiment in the structure of the blocking portion PW. The blocking portion PW in the semiconductor memory device 1 according to the second embodiment includes, for example, concave portions P1 to P3.

Each of the concave portions P1 to P3 has the same structure as the blocking portion PW described in the first embodiment. That is, each of the concave portions P1 to P3 includes the insulating film 55 that divides the structure of the dummy transistor DT and covers the side and bottom surfaces of the divided dummy transistor DT. Thus, each of the concave portions P1 to P3 is buried by the insulator 56.

Each of the concave portions P1 to P3 may be provided with the same width as the blocking portion PW of the first embodiment, or may be provided with a width narrower than the blocking portion PW of the first embodiment. Preferably, each of the concave portions P1 to P3 divides the structure of the same dummy transistor DT and is arranged side by side. In the second embodiment, the number of concave portions provided in the blocking portion PW is not limited to three, and it is sufficient as long as at least two or more concave portions are provided. Since the other structures of the semiconductor memory device 1 according to the second embodiment are the same as those of the first embodiment, the descriptions thereof are omitted.

[2-2] Effects of the Second Embodiment

As described above, the semiconductor memory device 1 according to the second embodiment includes the plurality of concave portions P1 to P3 each having the same function as the blocking portion PW in the first embodiment, in the blocking portion PW. For that reason, the blocking portion PW in the second embodiment can more reliably block the hydrogen penetration path from the stacked wiring portion to the CMOS portion, and therefore is more likely to suppress performance degradation of the transistor TR due to the hydrogen generated in the stacked wiring portion.

Further, in the semiconductor memory device 1 according to the second embodiment, since the plurality of concave portions P1 to P3 are periodic patterns, the processing variation can be reduced more than that of the blocking portion PW in the first embodiment. As a result, the semiconductor memory device 1 according to the second embodiment can improve the yield compared to the first embodiment.

[3] Third Embodiment

In the semiconductor memory device 1 according to the third embodiment, an ion implantation process for the blocking portion PW is added to the manufacturing method described in the first embodiment. The following describes differences of the semiconductor memory device 1 according to the third embodiment from the first and second embodiments.

[3-1] Configuration of Semiconductor Memory Device 1

Figure 30:
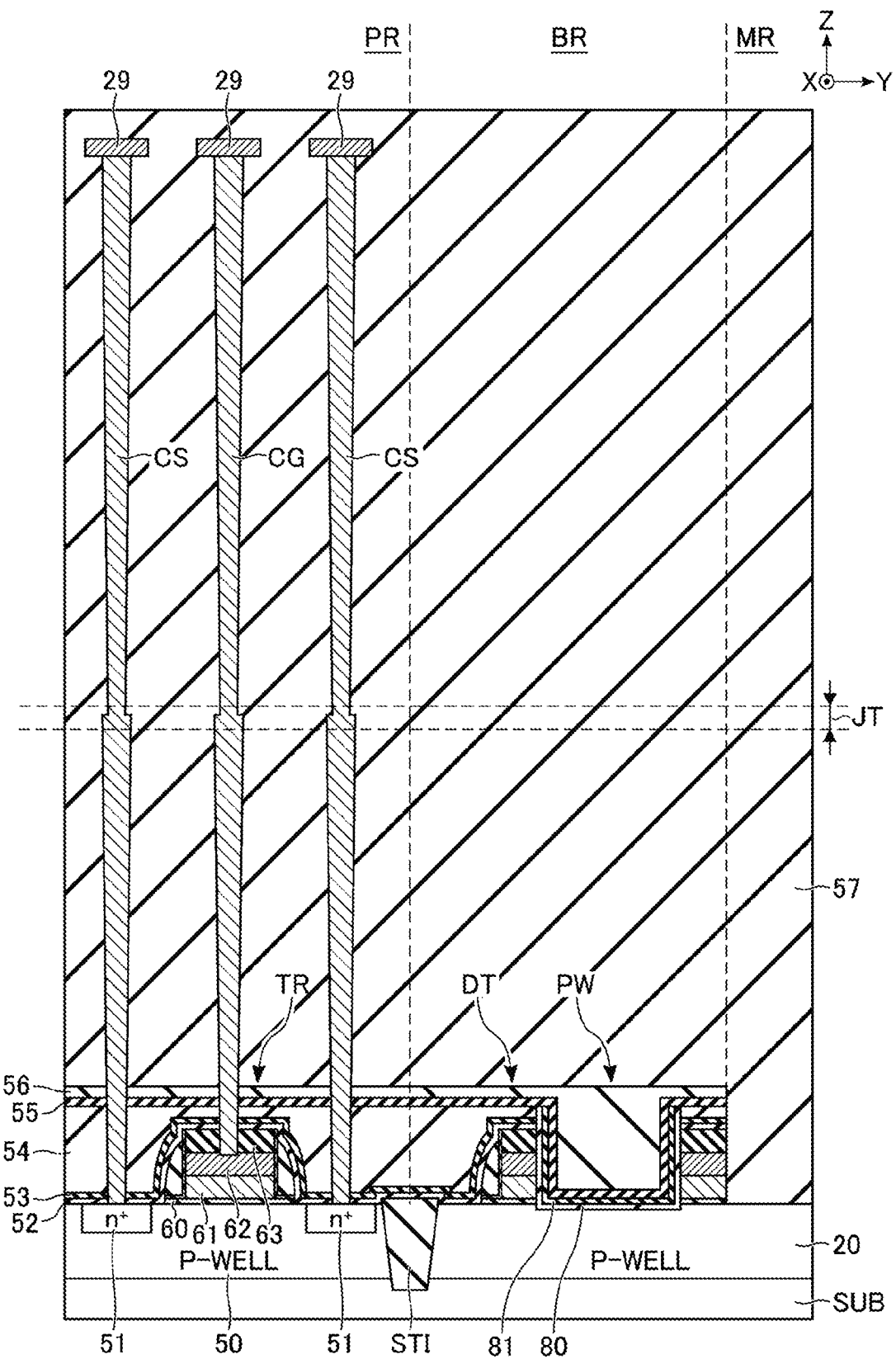
FIG. 30 illustrates a cross-sectional view of a peripheral circuit region of a semiconductor memory device according to a third embodiment.

FIG. 30 shows an example of a cross-sectional structure in the peripheral circuit region PR of the semiconductor memory device 1 according to the third embodiment, and shows the same region as FIG. 8 described in the first embodiment. As shown in FIG. 30, the semiconductor memory device 1 according to the third embodiment is different in the structure of the blocking portion PW from the first embodiment. The blocking portion PW in the semiconductor memory device 1 according to the third embodiment includes, for example, an oxide film 80 and an impurity layer 81 between the structure of the dummy transistor DT and the insulating film 55.

The oxide film 80 is a natural oxide film formed in the process of manufacturing the semiconductor memory device 1. The impurity layer 81 is a layer in which impurities are doped into the oxide film 80. In the third embodiment, the oxide film 80 may be entirely replaced with the impurity layer 81, and the impurity layer 81 only needs to be provided at least on the side surface of the divided portion of the dummy transistor DT. The impurity layer 81 preferably blocks a path between the insulator 57 and the transistor TR via the insulator 54 and the oxide film 80. As the impurity doped into the impurity layer 81, for example, phosphorus, arsenic, boron or the like is used. Since other structures of the semiconductor memory device 1 according to the third embodiment are the same as those of the first embodiment, the descriptions thereof are omitted.

[3-1] Manufacturing Method of Semiconductor Memory Device 1

Figure 31:
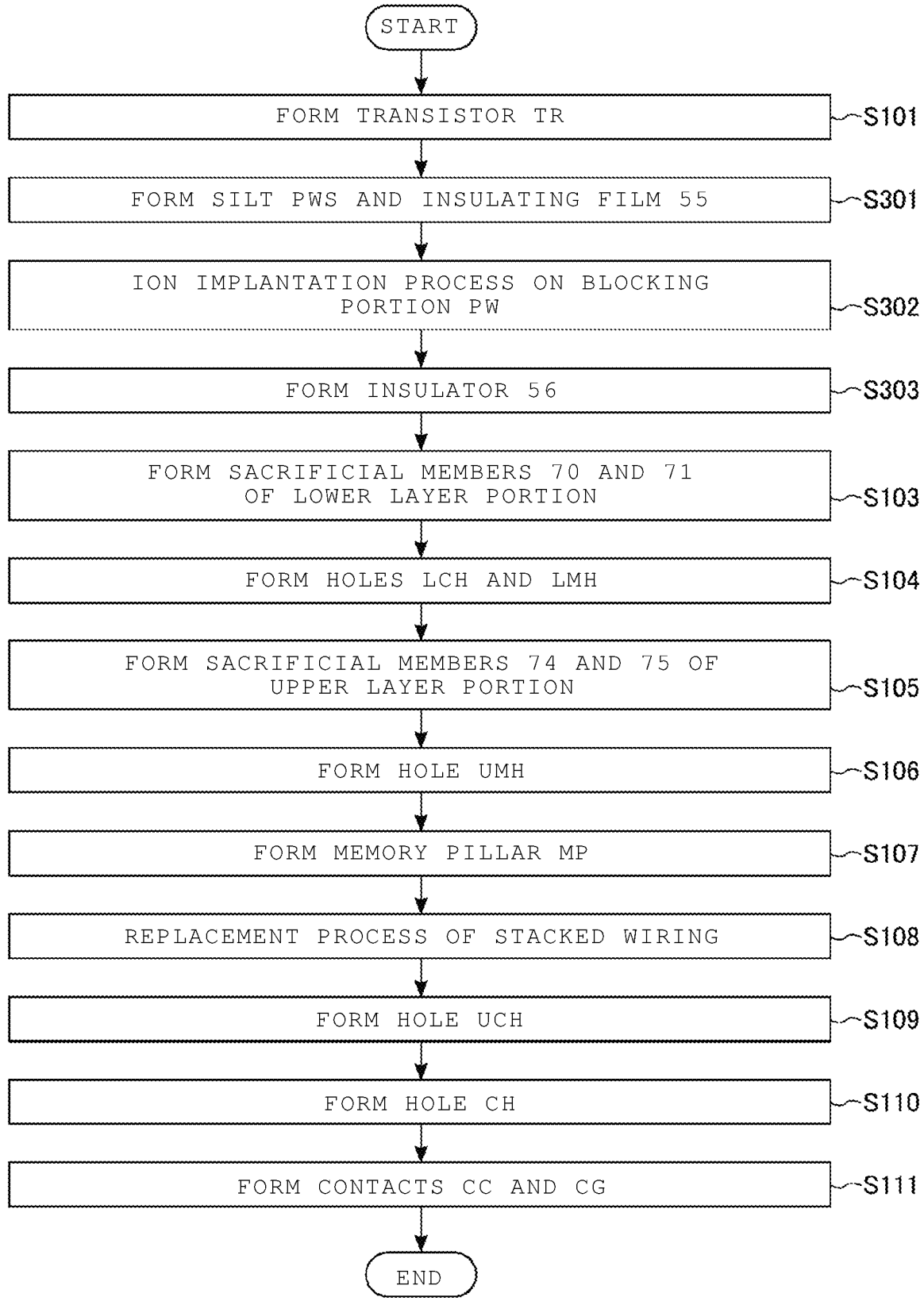
FIG. 31 is a flowchart showing an example of a manufacturing method of the semiconductor memory device according to the third embodiment.
Figure 33:
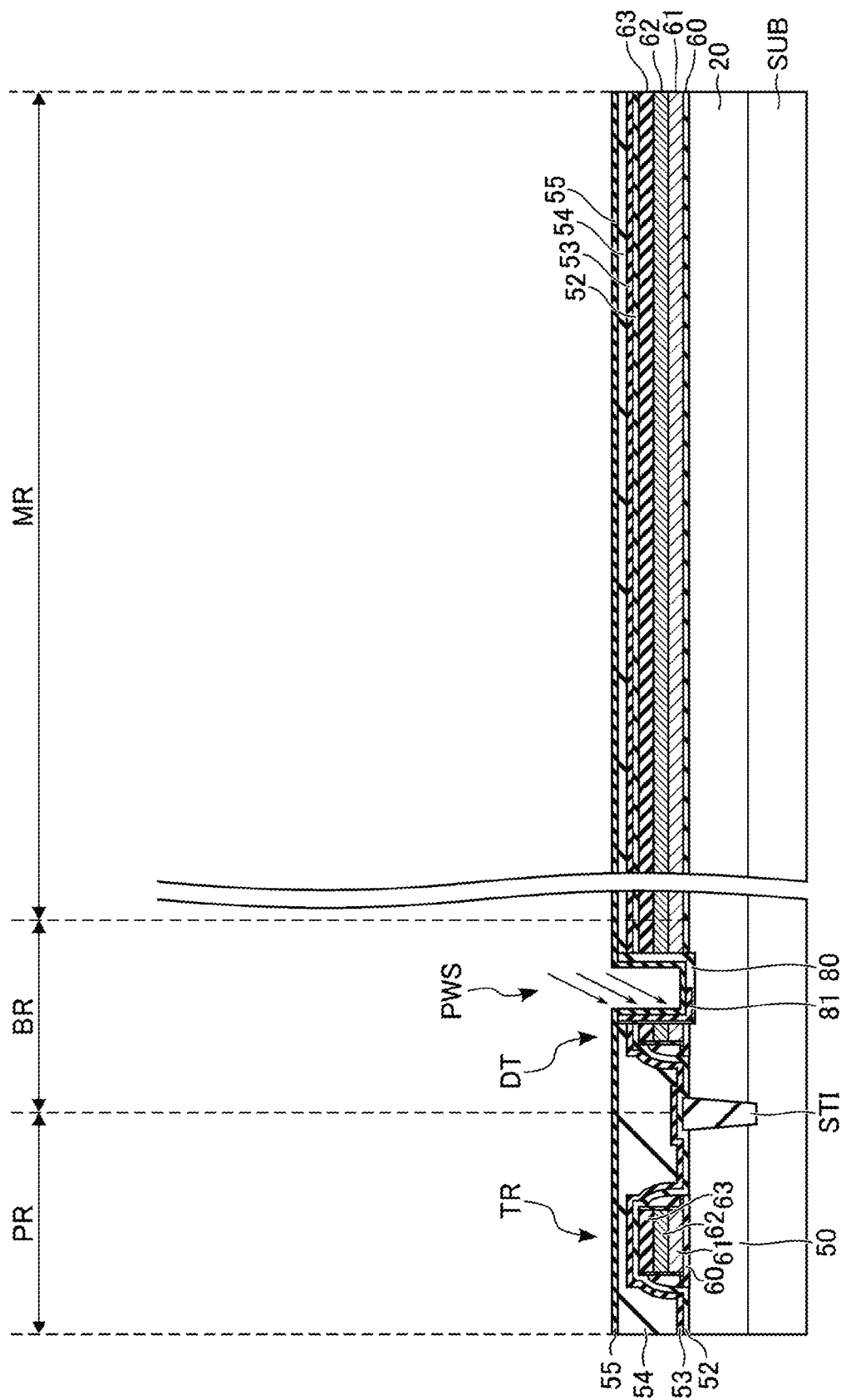
FIG. 33 illustrates a cross-sectional view of a structure in the process of manufacturing the semiconductor memory device according to the third embodiment.
Figure 34:
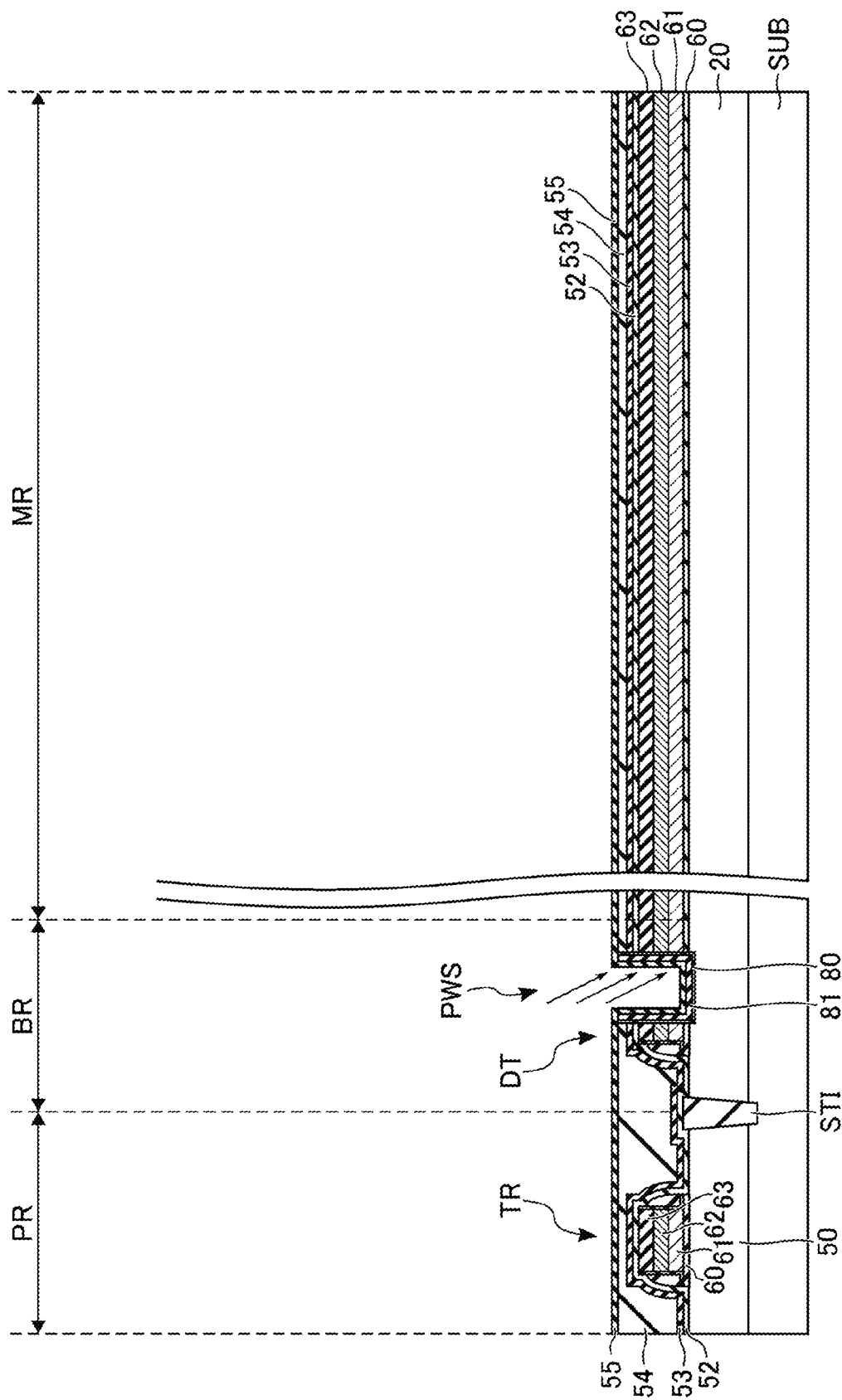
FIG. 34 illustrates a cross-sectional view of a structure in the process of manufacturing the semiconductor memory device according to the third embodiment.

Hereinafter, with reference to FIG. 31 as appropriate, an example of a series of manufacturing processes from the formation of the transistor TR to the formation of the contact CG in the semiconductor memory device 1 according to the third embodiment will be described while referring to differences from the first embodiment. FIG. 31 is a flowchart showing an example of a manufacturing method of the semiconductor memory device 1 according to the third embodiment. Each of FIGS. 32 to 34 is an example of a cross-sectional structure in the process of manufacturing the semiconductor memory device 1 according to the third embodiment, and shows the same region as FIG. 26 described in the first embodiment.

As shown in FIG. 31, in the method of manufacturing the semiconductor memory device 1 according to the third embodiment, the process of step S102 described in the first embodiment is replaced with the processes of steps S301 to S303. In other words, in the third embodiment, a new process is inserted into the process of forming the blocking portion PW in the first embodiment.

Figure 32:
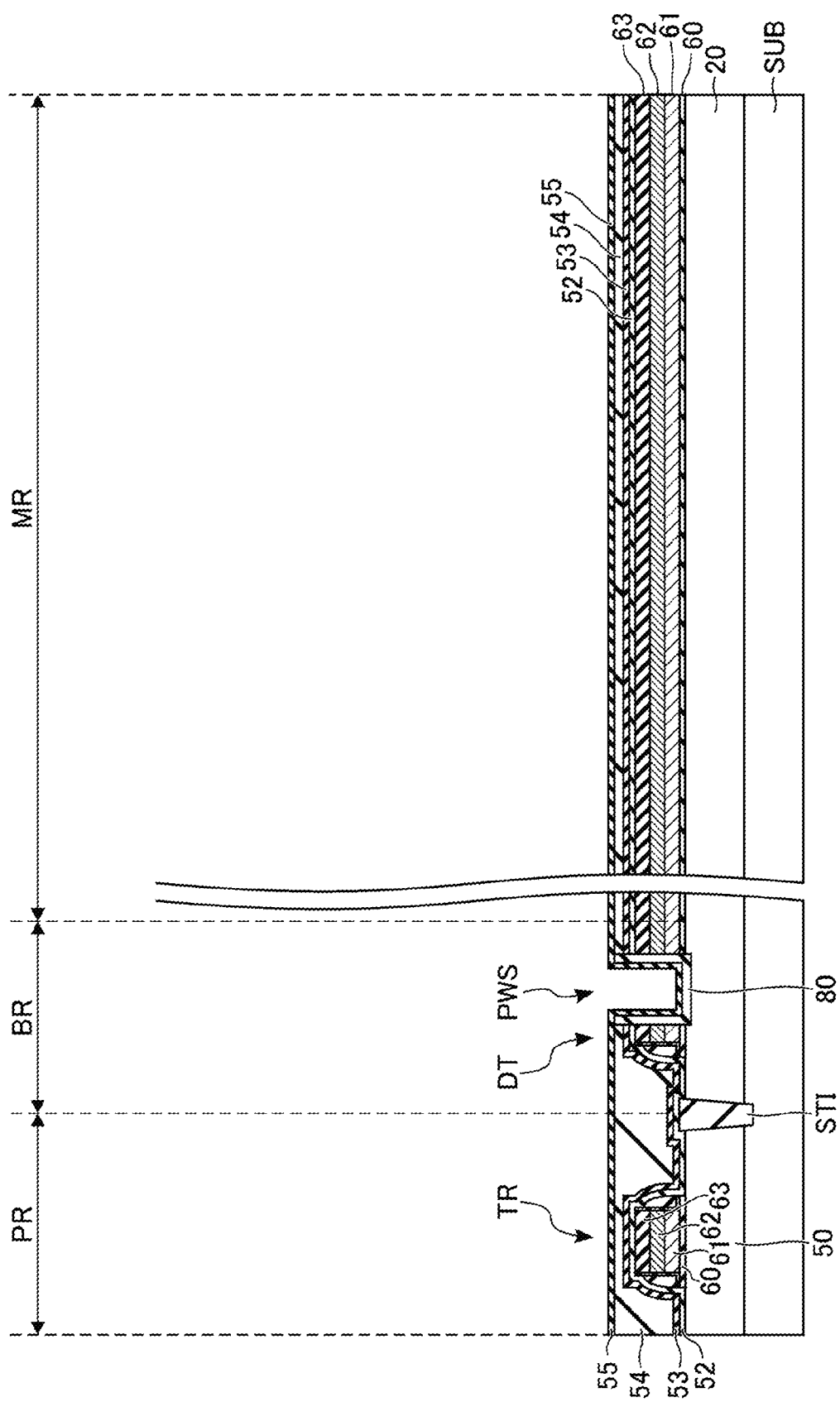
FIG. 32 illustrates a cross-sectional view of a structure in the process of manufacturing the semiconductor memory device according to the third embodiment.

Specifically, in the process of step S301, the slit PWS and the insulating film 55 are formed as in the first embodiment, and the structure shown in FIG. 32 is formed. As shown in FIG. 32, in the third embodiment, the oxide film 80 is formed between the structure of the dummy transistor DT and the insulating film 55 as time elapses from the formation of the slit PWS until the insulating film 55 is formed.

Next, in the process of step S302, an ion implantation process is performed on the blocking unit PW. Specifically, as shown in FIG. 33, for example, an ion implantation process is performed from the right side of the paper toward the left side wall of the slit PWS, and the impurity layer 81 is formed on the oxide film 80 provided on the left side of the slit PWS. Subsequently, as shown in FIG. 34, the ion implantation process is performed from the left side of the paper toward the right side wall of the slit PWS, and the impurity layer 81 is formed on the oxide film 80 provided on the right side of the slit PWS. The ion implantation method is merely an example, and it is sufficient as long as the impurity layer 81 is formed on at least the left and right side walls of the slit PWS by the process of step S302.

Figure 35:
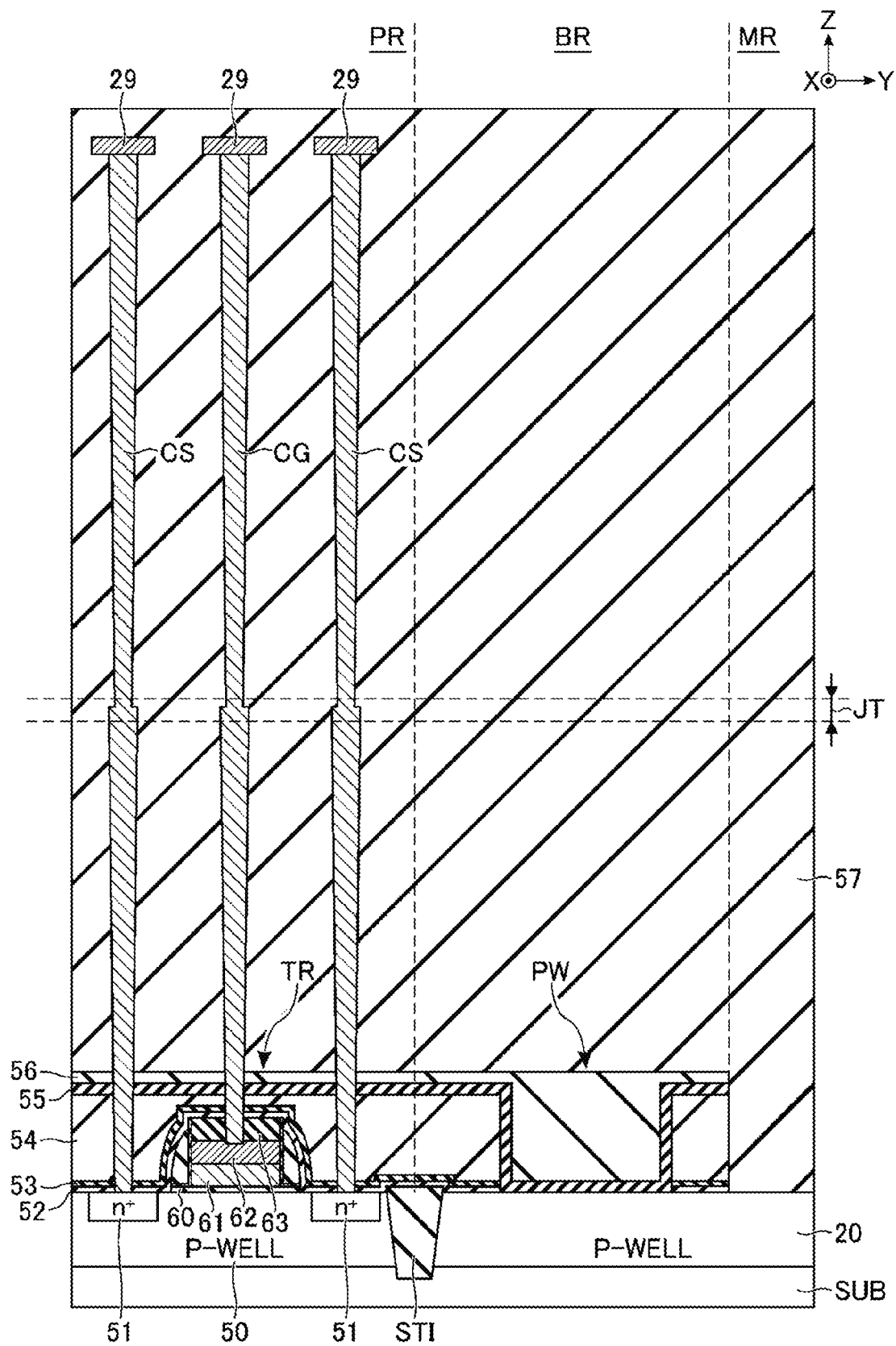
FIG. 35 illustrates a cross-sectional view of a peripheral circuit region of a semiconductor memory device according to a fourth embodiment.

Thereafter, in the process of step S303, the insulator 56 is formed on the insulating film 55, and the inside of the slit PWS is filled with the insulator 56. At this time, since a step is formed in accordance with the shape of the slit PWS, the upper surface of the insulator 56 is planarized by CMP, for example, as shown in FIG. 35. Subsequent manufacturing steps of the semiconductor memory device 1 according to the third embodiment are the same as those in the first embodiment, and the descriptions thereof will be omitted.

In the above description, the case where the ion implantation process is executed as a method for doping impurities into the natural oxide film (oxide film 80) is illustrated, but the present disclosure is not limited thereto. The vapor phase diffusion or the like may be used as a method of doping the oxide film 80 with impurities.

[3-2] Effects of the Third Embodiment

Since various manufacturing apparatuses are used in the manufacturing process of the semiconductor memory device, the time lapse between the manufacturing processes may vary depending on the operation status of the factory. For example, in the semiconductor memory device 1 according to the first embodiment, a natural oxide film may be formed on the exposed surface of the slit PWS as time elapses after the slit PWS is formed. Such a natural oxide film may serve as a hydrogen path when forming the stacked wiring portion.

In the method for manufacturing the semiconductor memory device 1 according to the third embodiment, after the slit PWS and the insulating film 55 are formed, the ion implantation process for the slit SLT is executed. As a result, in the semiconductor memory device 1 according to the third embodiment, impurities can be contained in the natural oxide film formed between the divided portion of the dummy transistor DT and the insulating film 55.

The impurity layer 81 formed in this way can suppress penetration of hydrogen more than a natural oxide film. As a result, the semiconductor memory device 1 according to the third embodiment can block the hydrogen penetration path from the stacked wiring portion to the CMOS portion. Therefore, the semiconductor memory device 1 according to the third embodiment can improve the yield as in the first embodiment.

[4] Fourth Embodiment

The semiconductor memory device 1 according to a fourth embodiment includes a blocking portion PW that does not overlap with the dummy transistor DT. The following describes differences of the semiconductor memory device 1 according to the fourth embodiment from the first to third embodiments.

[4-1] Configuration of Semiconductor Memory Device 1

FIG. 35 shows an example of a cross-sectional structure in the peripheral circuit region PR of the semiconductor memory device 1 according to the fourth embodiment, and shows the same region as FIG. 8 described in the first embodiment. As shown in FIG. 35, the semiconductor memory device 1 according to the fourth embodiment differs in the structure of the blocking portion PW from the first embodiment. Specifically, the semiconductor memory device 1 according to the fourth embodiment has a structure in which the dummy transistor DT is omitted and the blocking portion PW does not overlap with the dummy transistor DT. That is, the blocking portion PW in the fourth embodiment divides the insulating films 52 and 53 and the insulator 54 and is separated from the conductor layers 61 and 62 and the insulator layer 63. Since the other structures of the semiconductor memory device 1 according to the fourth embodiment are the same as those of the first embodiment, the descriptions thereof are omitted.

[4-2] Effects of Fourth Embodiment

The blocking unit PW in the semiconductor memory device 1 according to the fourth embodiment described above can block the hydrogen penetration path from the stacked wiring portion to the CMOS portion, as in the first embodiment. Therefore, the semiconductor memory device 1 according to the fourth embodiment can improve the yield as in the first embodiment.

[5] Other Modifications

The above embodiments may be combined with each other. For example, the ion implantation process in the third embodiment may be performed on the blocking portion PW in the second embodiment or the fourth embodiment. Moreover, the blocking portion PW in the first embodiment and the blocking portion PW in the fourth embodiment may be formed together. That is, the blocking portion PW may include a portion that overlaps with the dummy transistor DT and a portion that does not overlap with the dummy transistor DT.

Figure 36:
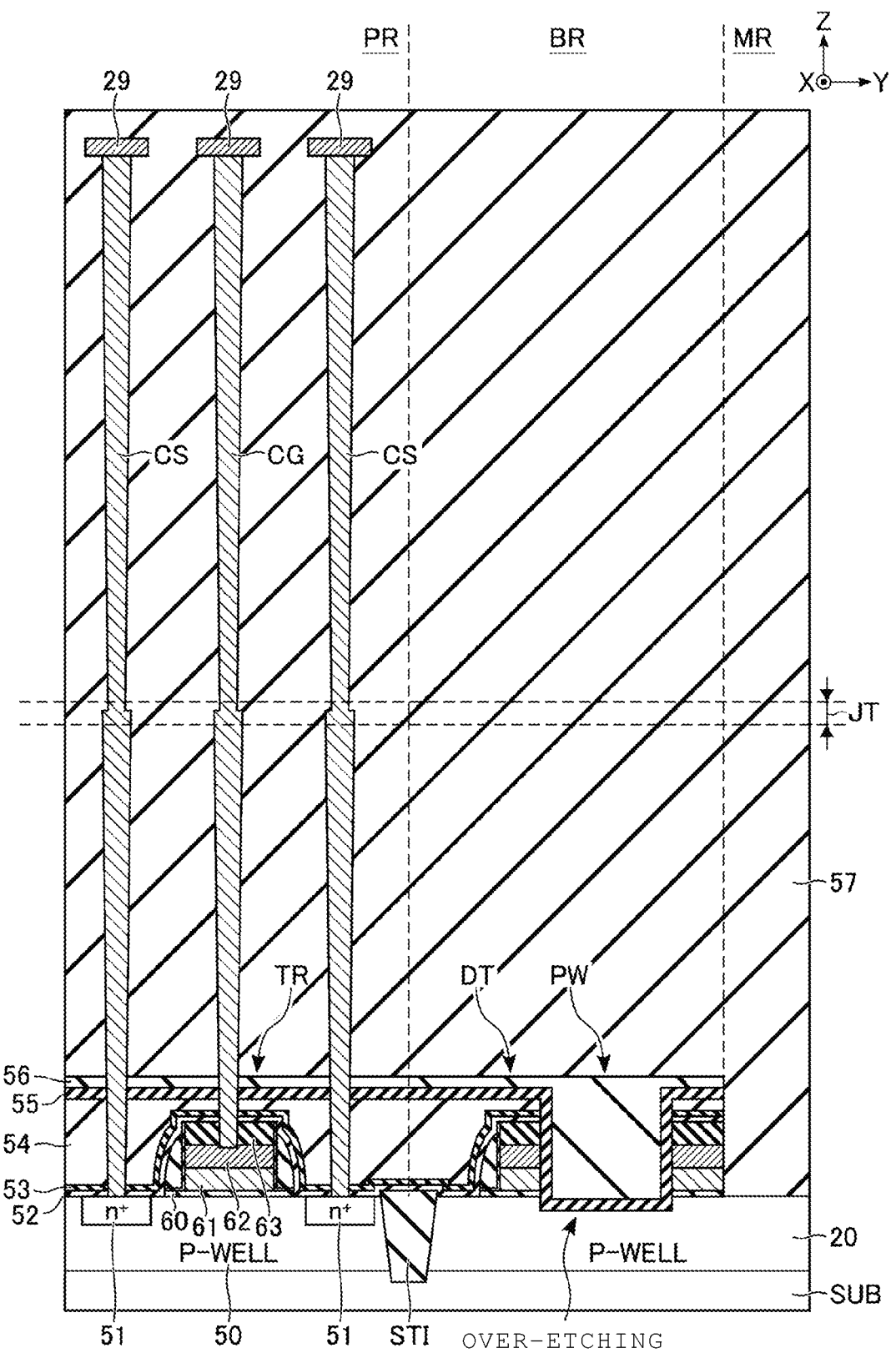
FIG. 36 illustrates a cross-sectional view of a peripheral circuit region of a semiconductor memory device according to a first modification of the first embodiment.

In the first embodiment, the case where the insulating film 55 provided on the bottom of the blocking portion PW is aligned with the surface of the P-type well region 20 is illustrated, but the blocking portion PW may enter the P-type well region 20. FIG. 36 shows an example of a cross-sectional structure in the peripheral circuit region PR of the semiconductor memory device 1 according to the first modification of the first embodiment, and shows a region similar to FIG. 8 described in the first embodiment.

The structure shown in FIG. 36 is formed by over-etching in the etching process for forming the slit PWS. The insulating film 55 according to a first modification of the first embodiment covers the side surface of the divided dummy transistor DT in a wider range than the first embodiment. That is, the structure of the semiconductor memory device 1 according to the first modification of the first embodiment has a higher hydrogen blocking performance than the first embodiment. As a result, the semiconductor memory device 1 according to the first modification of the first embodiment can improve the yield compared to the first embodiment. The first modification of the first embodiment may be combined with the second to fourth embodiments.

Figure 37:
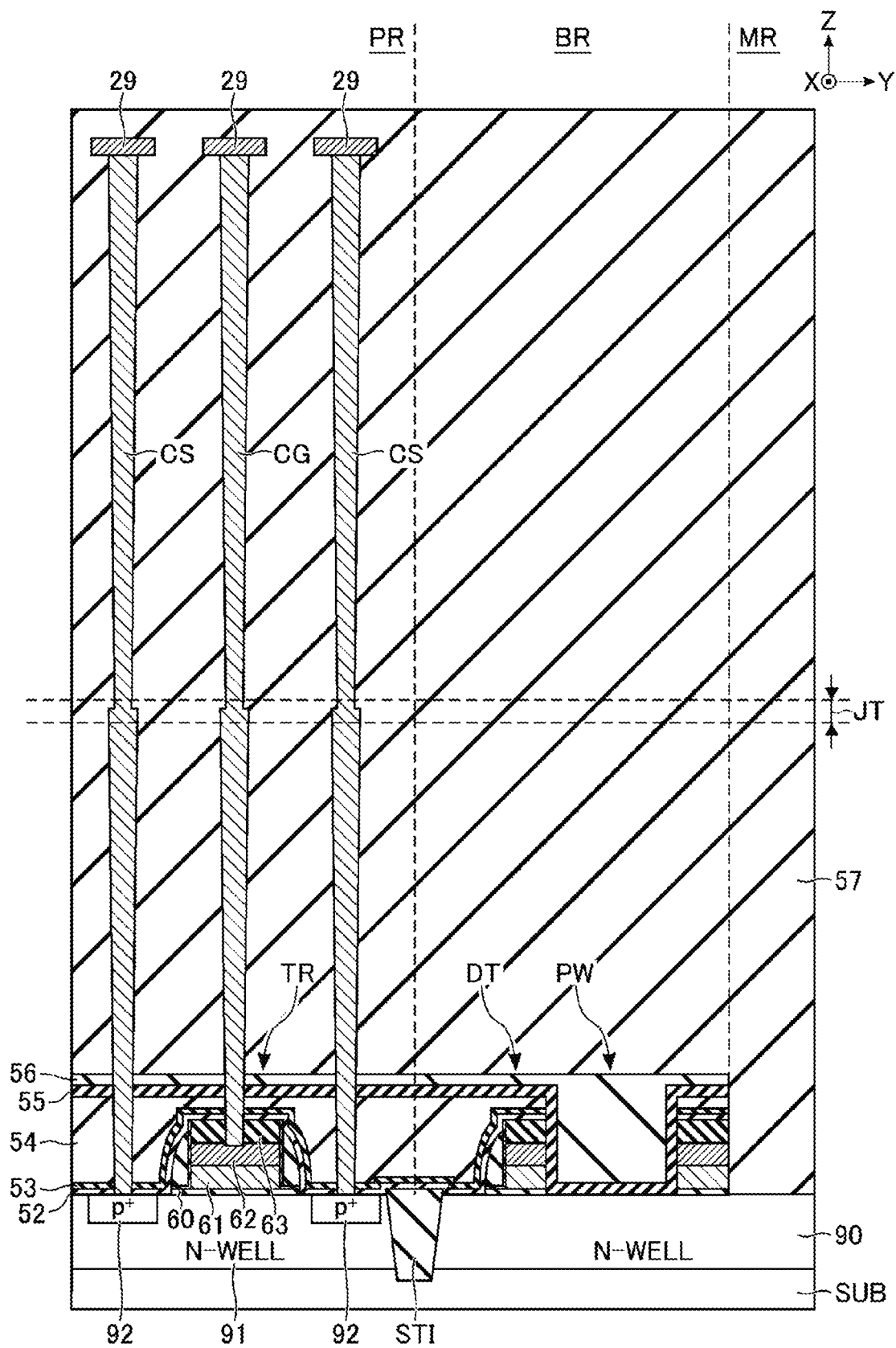
FIG. 37 illustrates a cross-sectional view of a peripheral circuit region of a semiconductor memory device according to a second modification of the first embodiment.

In the first embodiment, the case where the transistor TR and the dummy transistor DT are provided on the P-type well regions 50 and 20, respectively, and the blocking portion PW overlaps with the P-type well region 20 is illustrated, but the present disclosure is not limited thereto. For example, each of the transistor TR and the dummy transistor DT may be provided on the N-type well region. FIG. 37 shows an example of a cross-sectional structure in the peripheral circuit region PR of the semiconductor memory device 1 according to a second modification of the first embodiment, and shows a region similar to FIG. 8 described in the first embodiment.

As shown in FIG. 37, in the second modification of the first embodiment, the P-type well regions 20 and 50 are replaced with N-type well regions 90 and 91, respectively, and the N-type semiconductor region 51 is replaced with a P-type semiconductor region 92. Each of the N-type well regions 90 and 91 is provided in the vicinity of the surface of the semiconductor substrate SUB. For example, the N-type well region 90 and the N-type well region 91 are separated by the insulating region STI. On the N-type well region 90, the dummy transistor DT and the blocking portion PW are provided. A P-type transistor TR is provided on the N-type well region 91. The P-type semiconductor region 92 is a P-type impurity diffusion region provided in the vicinity of the surface of the N-type well region 91 and corresponds to the source or drain of the P-type transistor TR provided in the peripheral circuit region PR. The P-type semiconductor region 92 is doped with boron, for example.

The semiconductor memory device 1 may have any structure of the first to fourth embodiments, and the first and second modifications of the first embodiment, or may have a combination of these structures. That is, the semiconductor memory device 1 includes a blocking portion PW that is at least in contact with the surface of the semiconductor substrate SUB (N-type well region, P-type well region, or the like). Thus, the semiconductor memory device 1 only needs to have a structure in which the upper side of the transistor TR is covered with the insulating film 55 having a portion provided along the blocking portion PW.

In the above embodiment, the case where the dummy transistor DT and the insulating region STI are separated is illustrated, but the dummy transistor DT and the insulating region STI may overlap each other. When the dummy transistor DT is provided on the insulating region STI, it is conceivable that the dummy transistor DT is formed lower than the transistor TR in the peripheral circuit region PR by processing variation of CMP or the like. That is, it is conceivable that the thickness of the insulator 54 on the dummy transistor DT is formed thick. In any of the first to fourth embodiments, it is possible to block the hydrogen penetration path by the insulator 54 formed thick on the dummy transistor DT in this way.

Further, for example, since a silicon oxide film is filled in the insulating region STI, the insulating region STI may be a hydrogen path from the stacked wiring portion to the CMOS portion. For this reason, when the dummy transistor DT is provided on the insulating region STI, the blocking portion PW is preferably arranged between the insulating region STI and the stacked wiring portion. Thus, the blocking portion PW can also block the hydrogen path via the insulating region STI.

In the above embodiments, the memory cell array 10 may have other structures. For example, the memory pillar MP may have a structure that is not divided into an upper layer portion and a lower layer portion, or may have a structure in which three or more pillars are connected in the Z-direction. Further, the memory pillar MP may have a structure in which a pillar corresponding to the select gate line SGD and a pillar corresponding to the word line WL are connected.

In the drawings used for description in the embodiments, the case where the slits SLT have the same width in the Z-direction is illustrated, but the present disclosure is not limited thereto. For example, the slit SLT may have a tapered shape or an inversely tapered shape, or may have a shape in which the middle portion is swollen. Similarly, the memory pillar MP and the contacts CS and CG may have a tapered shape or an inversely tapered shape in each of a portion provided in an upper layer than the junction layer JT and a portion provided in a lower layer than the junction layer JT, and may have a shape in which the middle portion is swollen. In the embodiments, the case where the cross-sectional structures of the memory pillar MP and the contact CC are circular is illustrated, but these cross-sectional structures may be elliptical, and may be designed in any shape.

In this specification, "connection" indicates that they are electrically connected, and does not exclude, for example, that another element is interposed therebetween. "Electrically connected" may be through an insulator as long as the elements can operate in the same manner as the electrically connected one. "Columnar" indicates a structure provided in a hole formed in the manufacturing process of the semiconductor memory device 1. In this specification, "left and right side walls" indicate one side wall and the other side wall of the slit. The "region" may be regarded as a configuration included by the semiconductor substrate SUB. For example, when the semiconductor substrate SUB is defined to include the memory region MR, the peripheral circuit region PR, and the end region ER, the memory region MR, the peripheral circuit region PR, and the end region ER are associated with each other in different regions above the semiconductor substrate SUB. "The insulating film 55 surrounds the peripheral circuit region PR" includes that a contact penetrates the insulating film 55.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a semiconductor substrate including a first region on which memory cells are provided, a second region on which a control circuit of the memory cells is provided, and a third region separating the first region and the second region;
   a first conductor layer above the second region of the semiconductor substrate, the first conductor layer being a gate electrode of a transistor included in the control circuit;
   a first interlayer insulating film above the transistor in the second region and above the third region of the semiconductor substrate; and
   a first insulator layer provided above the first interlayer insulating film, the first insulator layer being a single layer, being composed of a material different from a material of the first interlayer insulating film, and containing silicon and nitrogen, the first insulator layer including:
     a first portion that is above the first conductor layer and extends along a surface direction of the semiconductor substrate, and
     a second portion that is continuous with the first portion and extends along a thickness direction of the semiconductor substrate from the first portion toward a surface of the semiconductor substrate in the third region, wherein the second portion is in contact with the semiconductor substrate.

2. The semiconductor memory device according to claim 1, wherein the first insulator layer is a silicon nitride film.

3. The semiconductor memory device according to claim 1, wherein a thickness of the first insulator layer is uniform between the first portion and the second portion.

4. The semiconductor memory device according to claim 1, further comprising:
   a second insulator layer including a first portion between the first conductor layer and the first portion of the first insulator layer and a second portion along a side wall of the first conductor layer.

5. The semiconductor memory device according to claim 4, wherein each of the first insulator layer and the second insulator layer is a silicon nitride film.

6. The semiconductor memory device according to claim 1, further comprising:
   a contact that extends through the first insulator layer and the first interlayer insulating film along the thickness direction of the semiconductor substrate and is in contact with the first conductor layer and the first interlayer insulating film.

7. The semiconductor memory device according to claim 1, wherein the second portion of the first insulator layer surrounds the first region of the semiconductor substrate.

8. The semiconductor memory device according to claim 1, further comprising:
   a second conductor layer above the third region of the semiconductor substrate at a same layer level as the first conductor layer, wherein
   the second portion of the first insulator layer extends through the second conductor layer along the thickness direction of the semiconductor substrate.

9. The semiconductor memory device according to claim 8, wherein the second conductor layer serves as a gate electrode of a dummy transistor.

10. The semiconductor memory device according to claim 8, wherein the first insulator layer further includes:
    a third portion that is continuous with the first portion, extends along the thickness direction of the semiconductor substrate from the first portion toward the surface of the semiconductor substrate in the third region, wherein the third portion is between the second portion and the first conductor layer.

11. The semiconductor memory device according to claim 10, wherein the third portion of the first insulator layer extends through the second conductor layer along the thickness direction of the semiconductor substrate.

12. The semiconductor memory device according to claim 8, further comprising:
a third insulator layer between the second portion of the first insulator layer and the second conductor layer, wherein
the third insulator is doped with impurities.

13. The semiconductor memory device according to claim 1, wherein the first insulator layer further includes:
a third portion that is continuous with the first portion, extends along the thickness direction of the semiconductor substrate from the first portion toward the surface of the semiconductor substrate in the third region, wherein
the third portion is between the second portion and the first conductor layer.

14. The semiconductor memory device according to claim 1, wherein the second portion of the first insulator layer contacts the surface of the semiconductor substrate in the third region.

15. The semiconductor memory device according to claim 1, wherein the second portion of the first insulator layer extends into the semiconductor substrate in the third region.

16. The semiconductor memory device according to claim 1, wherein the third region of the semiconductor substrate is a p-well region.

17. The semiconductor memory device according to claim 1, wherein the third region of the semiconductor substrate is an n-well region.

18. The semiconductor memory device according to claim 1, wherein a width of the second portion of the first insulator layer is greater than a width of the first conductor layer.

19. The semiconductor memory device according to claim 1, further comprising:
a stack of conductor layers spaced from each other above the first region of the semiconductor substrate; and
a memory pillar extending through the stack of conductor layers.

20. A semiconductor memory device, comprising:
a semiconductor substrate including a first region on which memory cells are provided, a second region on which a control circuit of the memory cells is provided, and a third region separating the first region and the second region;
a first conductor layer above the second region of the semiconductor substrate, the first conductor layer being a gate electrode of a transistor included in the control circuit;
an oxide film in contact with the semiconductor substrate in the third region;
a first interlayer insulating film above the second region and the third region of the semiconductor substrate; and
a first insulator layer provided above the first interlayer insulating film, composed of a material different from a material of the first interlayer insulating film, and containing silicon and nitrogen, the first insulator layer including:
a first portion that is above the first conductor layer and extends along a surface direction of the semiconductor substrate, and
a second portion that is continuous with the first portion and extends along a thickness direction of the semiconductor substrate from the first portion toward a surface of the semiconductor substrate in the third region, wherein the second portion is in contact with the oxide film.

* * * * *